United States Patent
Liaw

(10) Patent No.: US 9,721,645 B1
(45) Date of Patent: Aug. 1, 2017

(54) SRAM ARRAYS AND METHODS OF MANUFACTURING SAME

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/144,467

(22) Filed: May 2, 2016

Related U.S. Application Data

(60) Provisional application No. 62/289,048, filed on Jan. 29, 2016.

(51) Int. Cl.
*G11C 11/00* (2006.01)
*G11C 11/414* (2006.01)
*H01L 27/11* (2006.01)
*G11C 11/412* (2006.01)
*G11C 11/413* (2006.01)
*G11C 11/419* (2006.01)

(52) U.S. Cl.
CPC .......... *G11C 11/414* (2013.01); *G11C 11/412* (2013.01); *G11C 11/413* (2013.01); *G11C 11/419* (2013.01); *H01L 27/11* (2013.01); *H01L 27/1104* (2013.01)

(58) Field of Classification Search
CPC ... G11C 11/412; G11C 11/413; G11C 11/419; H01L 27/11; H01L 27/1104
USPC .......................................................... 365/154
See application file for complete search history.

(56) References Cited

U.S. PATENT DOCUMENTS

| 6,950,354 B1 * | 9/2005 | Akiyoshi ................. G11C 7/22 365/189.05 |
|---|---|---|
| 7,236,396 B2 * | 6/2007 | Houston ............... G11C 11/412 257/E21.661 |
| 8,035,170 B2 * | 10/2011 | Inaba ...................... H01L 21/84 257/401 |
| 8,455,028 B2 * | 6/2013 | Breunig ................... A21B 3/07 426/233 |
| 8,605,523 B2 | 12/2013 | Tao et al. |
| 8,630,132 B2 | 1/2014 | Cheng et al. |

(Continued)

FOREIGN PATENT DOCUMENTS

TW          200744099 A     12/2007

*Primary Examiner* — Pho M Luu
(74) *Attorney, Agent, or Firm* — Slater Matsil, LLP

(57) ABSTRACT

An embodiment static random access memory (SRAM) array includes a first SRAM mini array having a first plurality of functional SRAM cells in a first column of the SRAM array. Each of the first plurality of functional SRAM cells share a first bit line (BL). The SRAM array further includes a second SRAM mini array having a second plurality of functional SRAM cells in the first column. Each of the second plurality of functional SRAM cells share a second BL independently controlled from the first BL. The SRAM array further includes and a SRAM dummy array between the first SRAM mini array and the second SRAM mini array. The SRAM dummy array includes a plurality of SRAM array abut dummy cells in the first column. A first endpoint of the first BL and a second endpoint of the second BL are disposed in the SRAM dummy array.

20 Claims, 19 Drawing Sheets

(56) References Cited

U.S. PATENT DOCUMENTS

| | | |
|---|---|---|
| 8,760,948 B2 | 6/2014 | Tao et al. |
| 9,129,707 B2 * | 9/2015 | Lin ........................ G11C 11/419 |
| 2005/0219914 A1 | 10/2005 | Sarin et al. |
| 2007/0283084 A1 | 12/2007 | Chiu et al. |
| 2008/0091969 A1 | 4/2008 | Kurumada et al. |
| 2014/0032871 A1 | 1/2014 | Hsu et al. |
| 2014/0119131 A1 | 5/2014 | Verma et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |

* cited by examiner

SRAM ARRAYS AND METHODS OF MANUFACTURING SAME

PRIORITY CLAIM AND CROSS-REFERENCE

This patent application claims priority to U.S. Provisional Application No. 62/289,048, filed on Jan. 29, 2016 and entitled "SRAM Arrays and Methods of Manufacturing Same," which application is hereby incorporated by reference herein as if reproduced in its entirety.

BACKGROUND

Static random access memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important. With the increasingly down-scaling of the already very small SRAM cells, however, such request is difficult to achieve. For example, the sheet resistance of metal lines, which form the word-lines and bit-lines of SRAM cells, becomes increasingly higher, and hence the RC delay of the word lines and bit-lines of SRAM cells is increased, preventing the improvement in the read speed and write speed.

When entering into nanometer era, SRAM cells are made very large to increase the SRAM cell efficiency. This, however, incurs two problems. Firstly, each bit-line has to be connected to more rows of SRAM cells, which induces higher bit-line metal coupling capacitance, and hence the differential speed of the differential bit-lines (bit-line and bit-line bar) is reduced. Secondly, each word-line also has to be connected to more columns of SRAM cells, resulting in longer word-lines and hence worsened resistance and increased RC delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
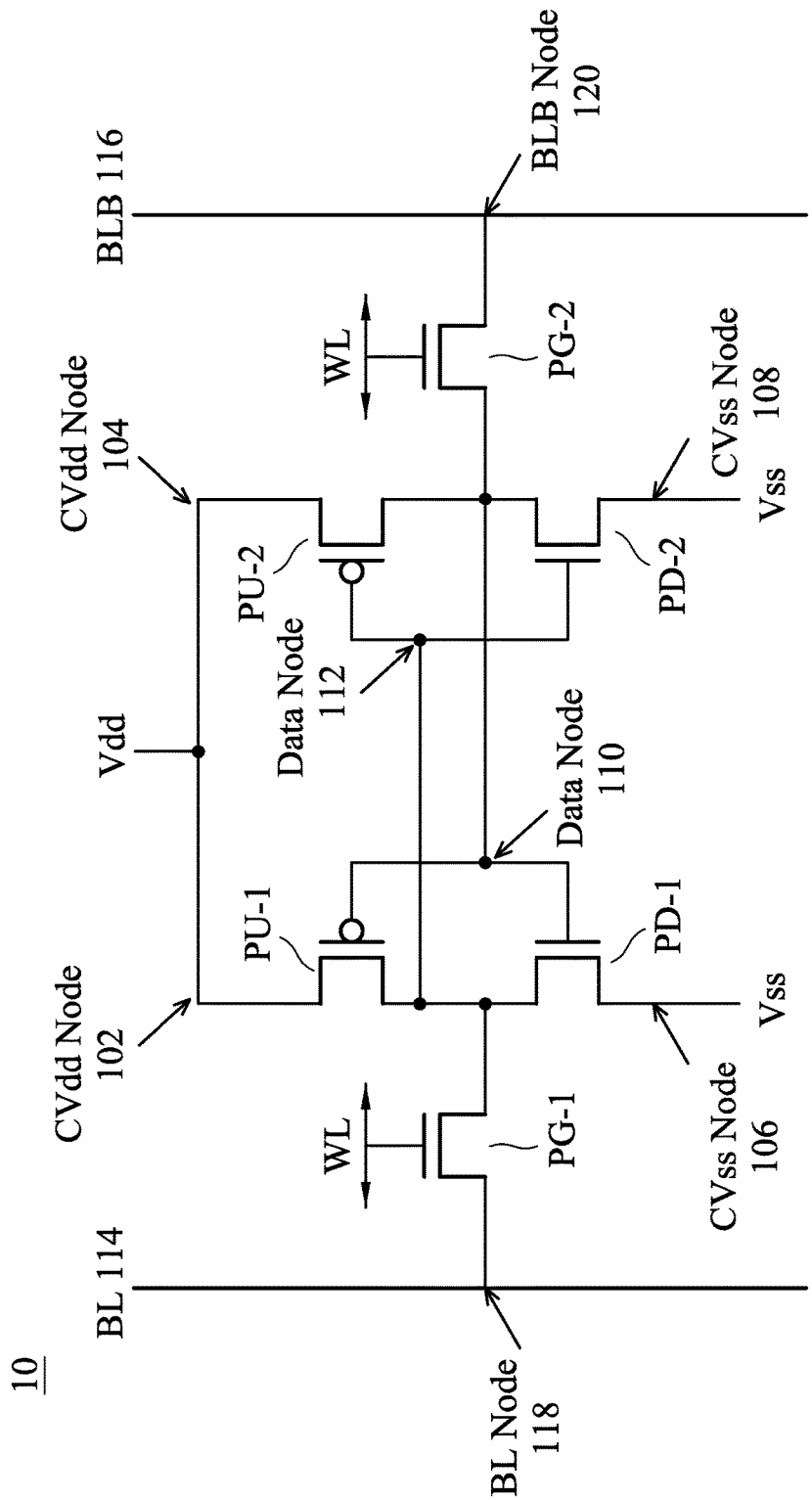
FIGS. 1 and 2 illustrate circuit diagrams of a static random access memory (SRAM) cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) cell, a SRAM dummy cell, and the corresponding SRAM array are provided in accordance with various exemplary embodiments. Some variations of some embodiments are discussed. Throughout the various views and illustrative embodiments, like reference numbers are used to designate like elements. Furthermore, although various embodiments are described in a particular context of SRAM layouts, other embodiments may also be applied to other memory cell configurations, such as, ROM cells, DRAM cells, MRAM cells, PRAM cells and RRAM cells.

FIG. 1 illustrates a circuit diagram of SRAM cell 10 in accordance with some embodiments. SRAM cell 10 includes pull-up transistors PU-1 and PU-2, which are P-type Metal-Oxide-Semiconductor (PMOS) transistors, and pull-down transistors PD-1 and PD-2 and pass-gate transistors PG-1 and PG-2, which are N-type Metal-Oxide-Semiconductor (NMOS) transistors. The gates of pass-gate transistors PG-1 and PG-2 are controlled by a word line (WL) that determines whether SRAM cell 10 is selected or not. A latch formed of pull-up transistors PU-1 and PU-2 and pull-down transistors PD-1 and PD-2 stores a bit, wherein the complementary values of the bit are stored in storage date (SD) node 110 and SD node 112. The stored bit can be written into, or read from, SRAM cell 10 through complementary bit lines including bit line (BL) 114 and bit line bar (BLB) 116. SRAM cell 10 is powered through a positive power supply node Vdd that has a positive power supply voltage (also denoted as CVdd). SRAM cell 10 is also connected to power supply voltage Vss (also denoted as CVss), which may be an electrical ground. Transistors PU-1 and PD-1 form a first inverter. Transistors PU-2 and PD-2 form a second inverter. The input of the first inverter is connected to transistor PG-1 and the output of the second inverter. The output of the first inverter is connected to transistor PG-2 and the input of the second inverter.

The sources of pull-up transistors PU-1 and PU-2 are connected to CVdd node 102 and CVdd node 104, respectively, which are further connected to power supply voltage (and line) Vdd. The sources pull-down transistors PD-1 and PD-2 are connected to CVss node 106 and CVss node 108, respectively, which are further connected to power supply voltage/line Vss. The gates of transistors PU-1 and PD-1 are connected to the drains of transistors PU-2 and PD-2, which form a connection node that is referred to as SD node 110. The gates of transistors PU-2 and PD-2 are connected to the drains of transistors PU-1 and PD-1, which connection node is referred to as SD node 112. A source/drain region of pass-gate transistor PG-1 is connected to bit line BL 114 at a BL node 118. A source/drain region of pass-gate transistor PG-2 is connected to bit line BLB 116 at a BLB node 120.

Figure 2:
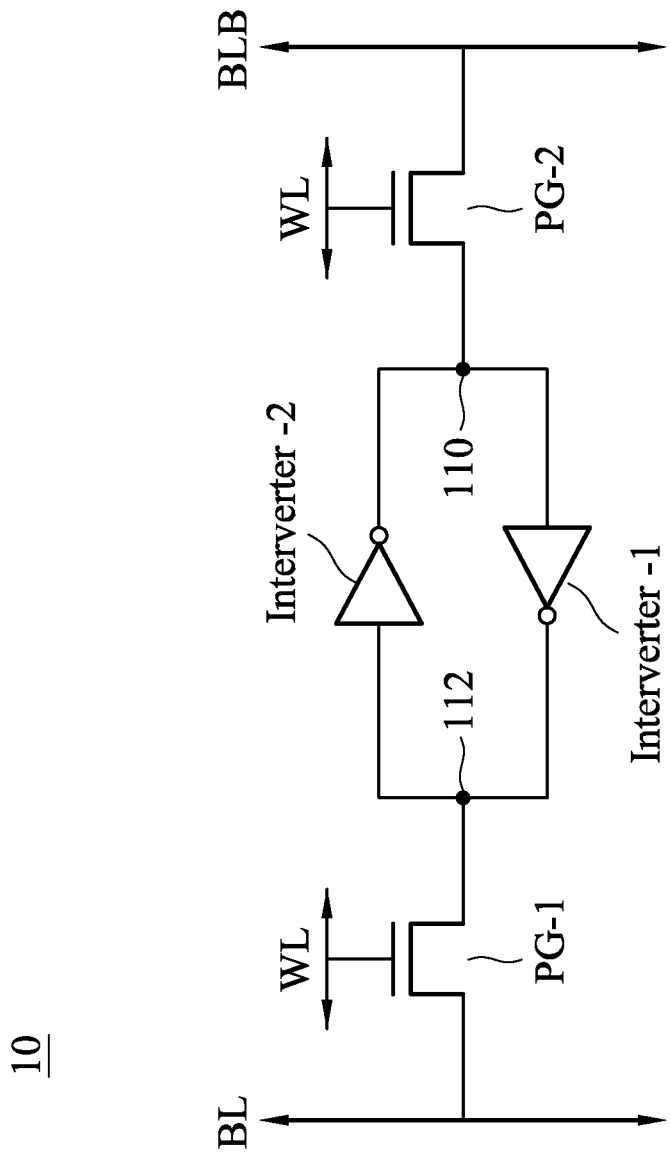

FIG. 2 illustrates an alternative circuit diagram of SRAM cell 10, wherein transistors PU-1 and PD-1 in FIG. 1 are represented as first inverter Inverter-1, and transistors PU-2 and PD-2 are represented as second inverter Inverter-2. The output of first inverter Inverter-1 (e.g., corresponding to SD node 112) is connected to transistor PG-1 and the input of the second inverter Inverter-2. The output of second inverter Inverter-2 (e.g., corresponding to SD node 110) is connected to transistor PG-2 and the input of first inverter Inverter-1. Thus, transistors PU-2/PD-2 and PU-1/PD-1 form a pair of cross connected inverters Inverter-1 and Inverter-2.

Figure 3:
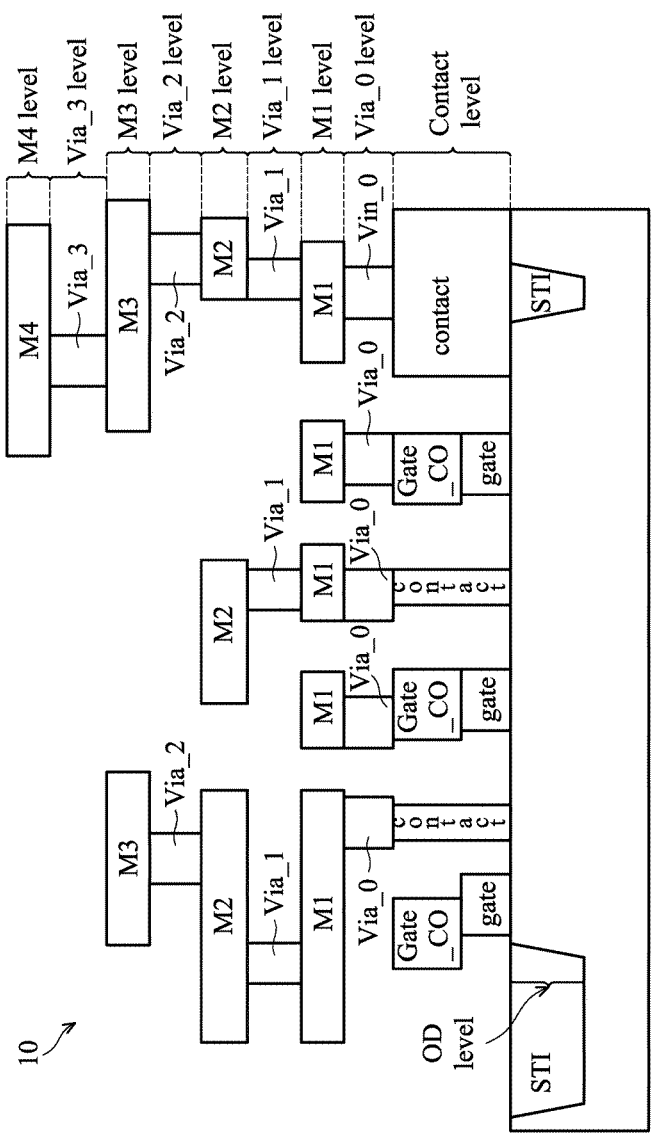
FIG. 3 illustrates a cross-sectional view of the layers involved in an SRAM cell array in accordance with some embodiments.

FIG. 3 illustrates a schematic cross-sectional view of a plurality of layers involved in SRAM cell 10, which layers are formed on a semiconductor chip or wafer. It is noted that FIG. 3 is schematically illustrated to show various levels of interconnect structure and transistors, and may not reflect the actual cross-sectional view of SRAM cell 10. The interconnect structure includes a contact level, an OD (wherein the term "OD" represents "active region") level, via levels Via_0 level, Via_1 level, Via_2 level, and Via_3 level, and metal-layer levels M1 level, M2 level, M3 level, and M4 level. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated exemplary transistors PU-1 and PU-2) to an overlying level such as the Via_0 level, and source/drain contacts (marked as "contact") for connecting the source/drain regions of transistors to the overlying level.

Figure 4:
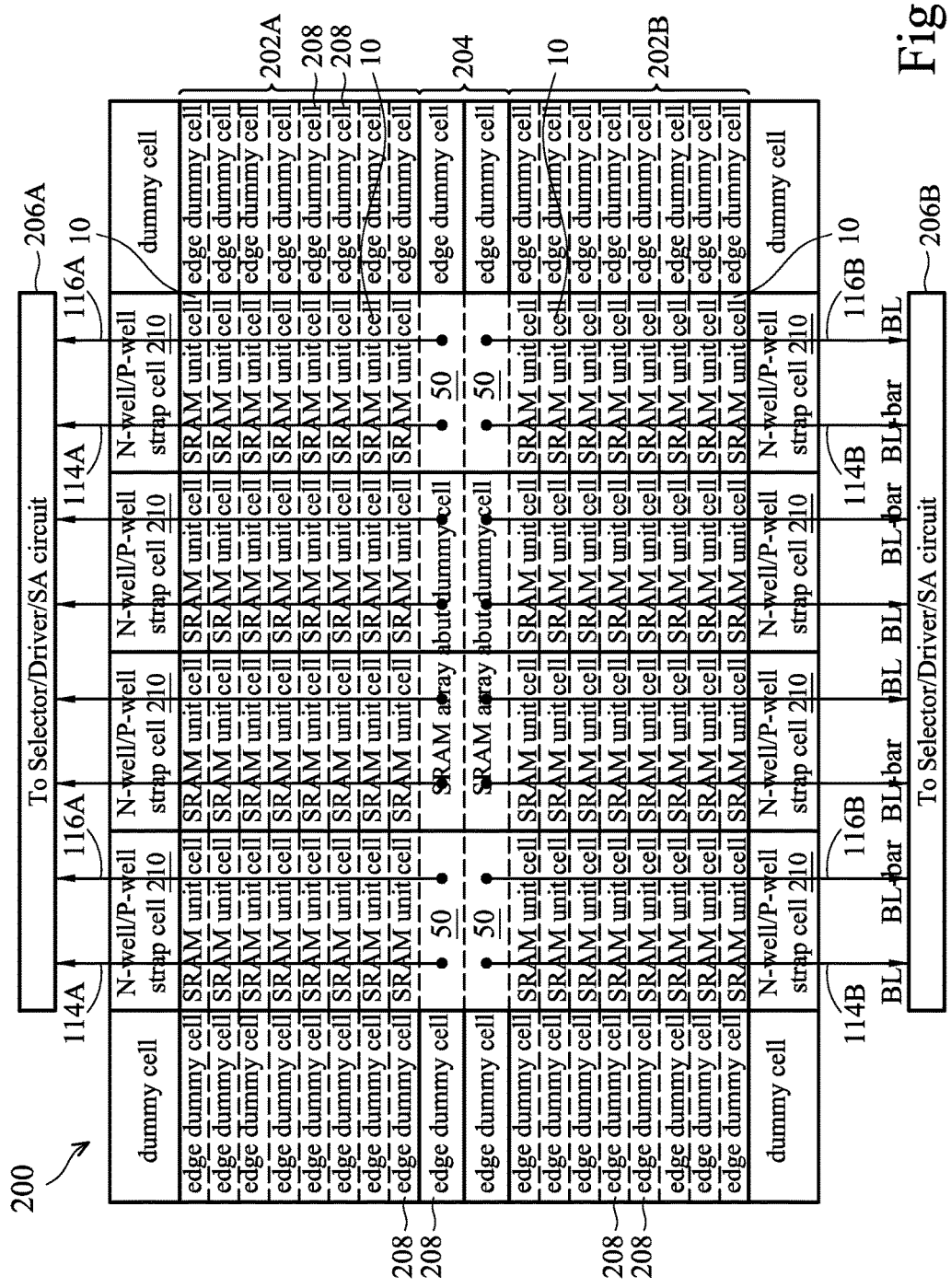
FIG. 4 illustrates a block diagram of an SRAM array in accordance with some embodiments.

Generally, multiple SRAM cells are arranged in a semiconductor die as a SRAM array. FIG. 4 illustrates a block diagram of SRAM array 200 according to some embodiments. SRAM array 200 includes at least two SRAM mini arrays 202A and 202B. SRAM mini arrays 202A and 202B each include a plurality of functional memory cells (SRAM cells 10). In an embodiment, each SRAM cell 10 in SRAM array 200 has a circuit layout as described above with respect to FIGS. 1 through 3. Other SRAM circuit layouts may be used in other embodiments. For example, FIGS. 1 through 3 illustrate a six port SRAM circuit layout with six transistors. Other embodiments may include SRAM cells 10 having a different number of ports, such as an eight port SRAM circuit layout, and various embodiments are not limited to a particular memory cell circuit.

SRAM cells 10 in each SRAM mini array 202A and 202B may be arranged in rows and columns. In an embodiment, each SRAM mini array 202A and 202B may include at least eight columns by four rows (denoted as "8×4") of SRAM cells, such as, 64×64 SRAM cells, 128×128 SRAM cells, 256×256 SRAM cells, or the like. The number of SRAM cells in mini array 202A may be the same or different than the number of SRAM cells in mini array 202B. However, the number of columns in mini array 202A and mini array 202B may generally be the same. Other embodiments may include mini arrays having a different number of memory cells, such as fewer or more memory cells.

As further illustrated by FIG. 4, SRAM dummy array 204 is disposed between SRAM mini array 202A and SRAM mini array 202B. In an embodiment, SRAM dummy array 204 includes two rows of SRAM array abut dummy cells 50. A first row of SRAM array abut dummy cells 50 abuts SRAM mini array 202A, and a second row of SRAM array abut dummy cells 50 abuts SRAM mini array 202B. The number of columns in SRAM dummy array 204 may generally be the same as mini arrays 202A and 202B. SRAM array abut dummy cells 50 may generally have a same size as SRAM cells 10. SRAM array abut dummy cells 50 may be incorporated into SRAM array 200 to adjoin SRAM mini arrays 202A and 202B so that SRAM mini arrays 202A and 202B may be deployed in close proximity of each other to reduce overall layout footprint of memory cells in a semiconductor die. Furthermore, although only two mini arrays are illustrated, an embodiment memory array may include any number of mini arrays having dummy arrays disposed between each pair of mini arrays. The layout of each SRAM cell 10 and SRAM array abut dummy cell 50 is be described in greater detail below.

Generally, SRAM cells 10 in a same column and SRAM mini array 202A/202B share a common BL 114 (labeled 114A/114B) and BLB 116 (labeled 114A/114B). For example, each SRAM cell 10 in a same column and SRAM mini array includes a portion of a BL and BLB, which when combined with other SRAM cells 10 in the column and SRAM mini array forms continuous conductive lines (the BL and the BLB). BLs 114 and BLBs 116 are electrically connected to control circuitry 206 (labeled 206A/206B), which activates certain BLs 114 and/or BLBs 116 to select a particular column in SRAM array 200 for read and/or write operations. In some embodiments, control circuitry 206 may further include amplifiers to enhance a read and/or write signal. For example, control circuitry 206 may include selector circuitry, driver circuitry, sense amplifier (SA) circuitry, combinations thereof, and the like.

As illustrated by FIG. 4, SRAM cells 10 in SRAM mini array 202A are electrically connected to control circuitry 206A by BLs 114A and BLBs 116A, and SRAM cells 10 in SRAM mini array 202B are electrically connected to control circuitry 206B by BLs 114B and BLBs 116B. Control circuitry 206A is physically separate and independent from control circuitry 206B. Furthermore BLs 114A/BLBs 116B in SRAM mini array 202A are physically separate and independent from BLs 114B/116B in SRAM mini array 202B. Thus, columns of SRAM mini array 202A can be controlled independently of columns of SRAM mini array 202B. In various embodiments, endpoints of BLs 114/BLBs 116 in each SRAM array column are disposed in SRAM dummy array 204. It has been observed that by including SRAM dummy array 204, SRAM mini arrays 202A and 202B may be deployed in relatively close proximity. Thus, embodiments provide larger SRAM arrays 200 (e.g., combining two SRAM mini arrays) with a smaller footprint/ greater density than two separately deployed SRAM arrays while still providing independent control of each SRAM mini array. Thus, the risk of overloading control circuitry with an excess of SRAM cells connected to a single BL/BLB can be advantageously reduced.

As further illustrated by FIG. 4, SRAM array 200 may further include additional dummy cells around a periphery of SRAM mini arrays 202A and 202B and SRAM dummy array 204. For example, each row of SRAM array 200 may begin and end with an edge dummy cell 208. Edge dummy cells 208 may have any suitable configuration and may be included for improved uniformity of fins and/or metal features.

Figure 11:
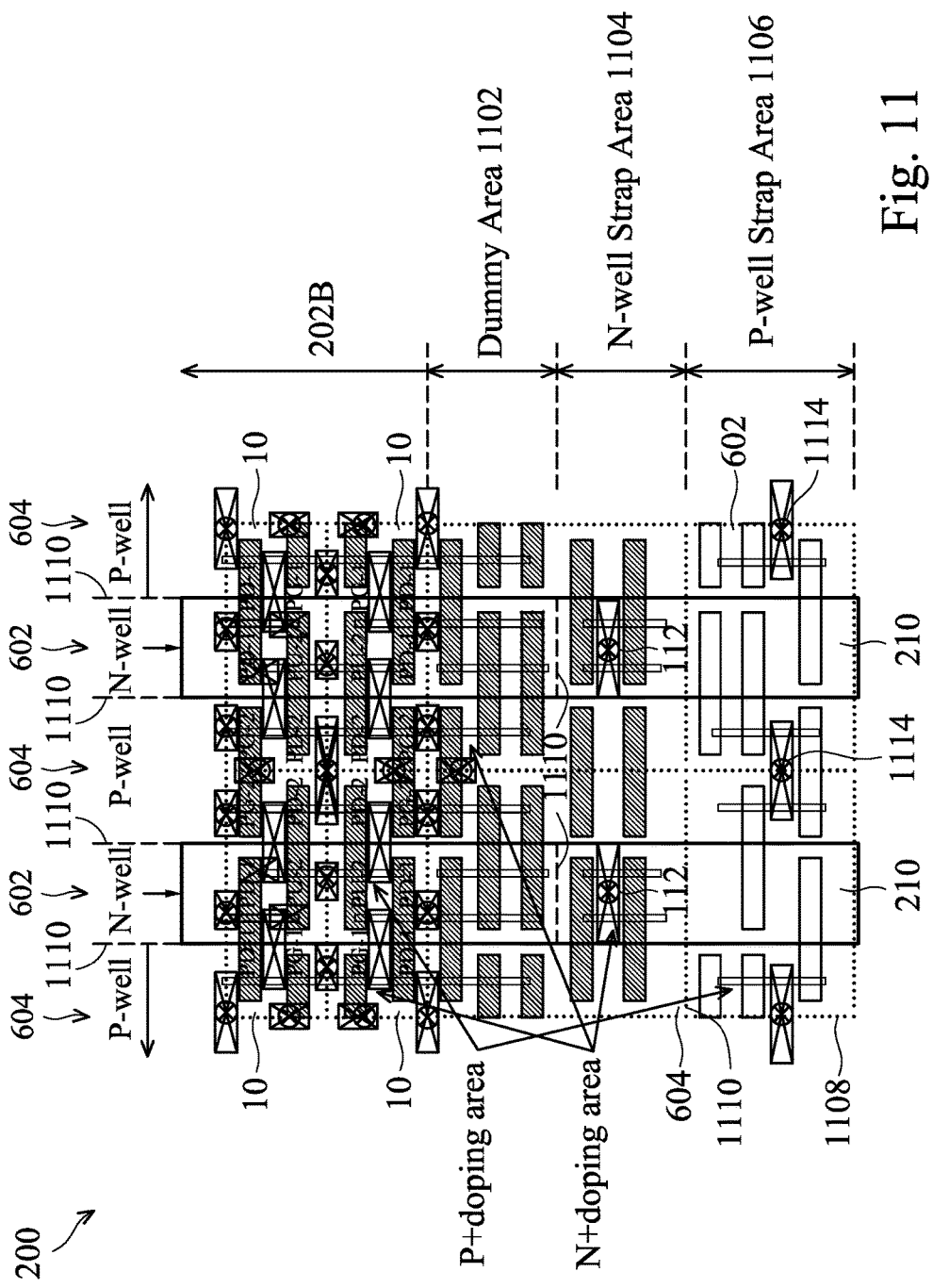
FIG. 11 illustrates a block diagram of N-well/P-well strap cells in accordance with some embodiments.

As another example, each column of SRAM array 200 may being and end with an N-well/P-well strap cell 210. N-well/P-well strap cells 210 may have any suitable configuration and may be included to prevent SRAM cells 10 from directly abutting against isolation regions (e.g., STI regions) at the OD level of the semiconductor die. For example, FIG. 11 illustrates an example layout of SRAM array 200 having N-well/P-well strap cells 210 adjoining SRAM mini array 202B with functional SRAM cells 10 SRAM array 200 further includes N-wells 602 (e.g., where the semiconductor substrate is doped with n-type dopants) and P-wells 604 (e.g., the semiconductor substrate is doped with p-type dopants). In FIG. 11, dotted lines 1108 generally denote boundaries between individual cells (e.g., SRAM cells 10 and N-well/P-well strap cells 210), and dashed lines 1110 generally denote boundaries between N-wells 602 and P-wells 604. Within each N-well 602, P+ doping areas may be included insource/drain regions, for example, of semiconductor fins. Similarly, within each P-well 604, N+ doping areas may be included in source/drain regions, for example, of semiconductor fins. The details of functional SRAM cells 10 will be explained in greater detail with respect to FIGS. 6A through 6E, below.

N-well/P-well strap cells 210 include a dummy area 1102 (e.g., having dummy gate electrodes and/or dummy fin structures) adjacent a functional SRAM cell 10. N-well/P-well strap cells 210 further includes an N-well strap area 1104 having first active regions with an appropriate concentration of n-type dopants (e.g., phosphorous (such as $^{31}$P), arsenic, or a combination thereof). First contacts 1112 are located in the first active regions and are electrically connected to an n-well. P-well strap areas 1106 are disposed adjacent the N-well strap areas 1104, and P-well strap areas 1106 include second active regions with an appropriate concentration of p-type dopants (e.g., boron (such as $^{11}$B), boron, boron fluorine (BF$_2$), or a combination thereof). Second contacts 1114 are located in the second active regions and are electrically connected to a p-well. Both N-well strap areas 1104 and P-well strap areas 1106 may further include dummy gate electrodes and/or dummy fin structures. Gate and/or source/drain contacts may be provided to the dummy gates and/or dummy source/drain regions in N-well/P-well strap cells 210 provide a dense environment for manufacturing margin improvement. In N-well strap areas 1104, additional vias and metal conductors electrically connect first contacts 1112 to Vdd voltage. In P-well strap areas 1106, additional vias and metal conductors to electrically connect second contacts 1114 to Vss voltage.

Figures 5A, 5B:
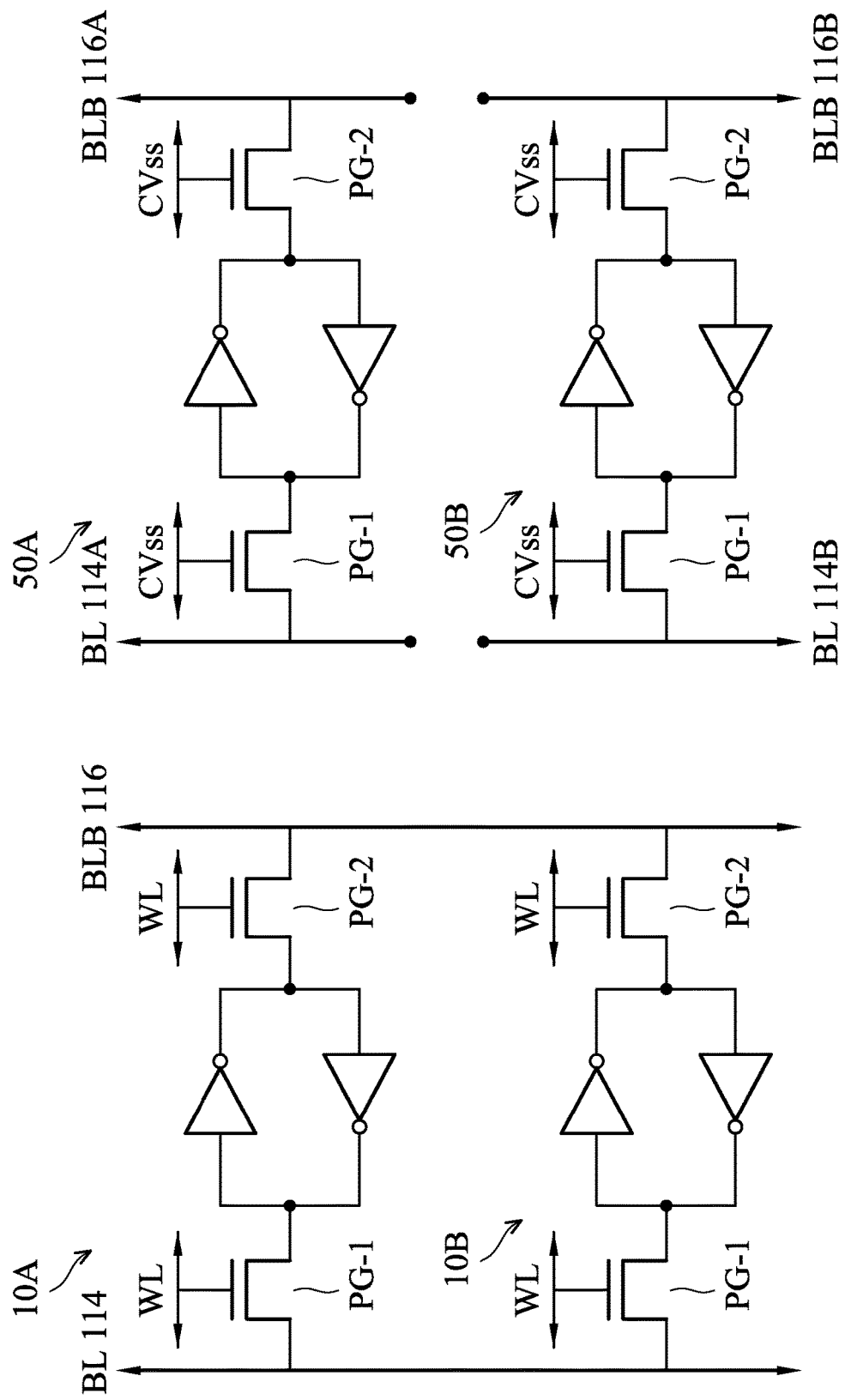
FIGS. 5A and 5B illustrate circuit diagrams of SRAM cells and SRAM array abut dummy cells in accordance with some embodiments.

FIG. 5A illustrates a circuit diagram of SRAM cells 10A and 10B in a same column of a same SRAM mini array (e.g., within SRAM mini array 202A or 202B, see FIG. 4). FIG. 5B illustrates a circuit diagram of SRAM array abut dummy cells 50A and 50B in a same column of a SRAM dummy array (e.g., within SRAM dummy array 204, see FIG. 4). As illustrated by FIGS. 5A and 5B, the circuit layouts of SRAM dummy abut cells 50A/50B are similar to SRAM cells 10A/10B. However, SRAM cells 10A/10B are share a continuous BL and a continuous BLB (e.g., BL 114 and BLB 116) while SRAM dummy abut cells 50A/50B include physically separated BLs/BLBs (e.g., BLs 114A/114B and BLBs 116A/116B). Furthermore, the gates of pass-gate transistors (e.g., PG-1/PG-2) of SRAM array abut dummy cells 50 (e.g., SRAM array abut dummy cells 50A/50B) are electrically connected directly to $CV_{ss}$ (e.g., electrical ground) in order to permanently deselect each SRAM array abut dummy cells 50 in SRAM array 200. In contrast, the gates of pass-gate transistors (e.g., PG-1/PG-2) of SRAM cells 10 (e.g., SRAM cells 10A/10B are electrically connected by WLs, which is used to select or deselect a row of a particular SRAM cell 10 for read/write operations in SRAM array 200.

FIGS. 6A through 6D illustrate block diagrams of a layout of features of a functional memory cell (e.g., SRAM cell 10) according to some embodiments. FIGS. 6A through 6D illustrates features in different levels of SRAM cell 10 (e.g., OD level, contact level, via_0 level, M1 level, via-1 level, M2 level, see FIG. 3), which are consecutively described for clarity.

Figure 6A:
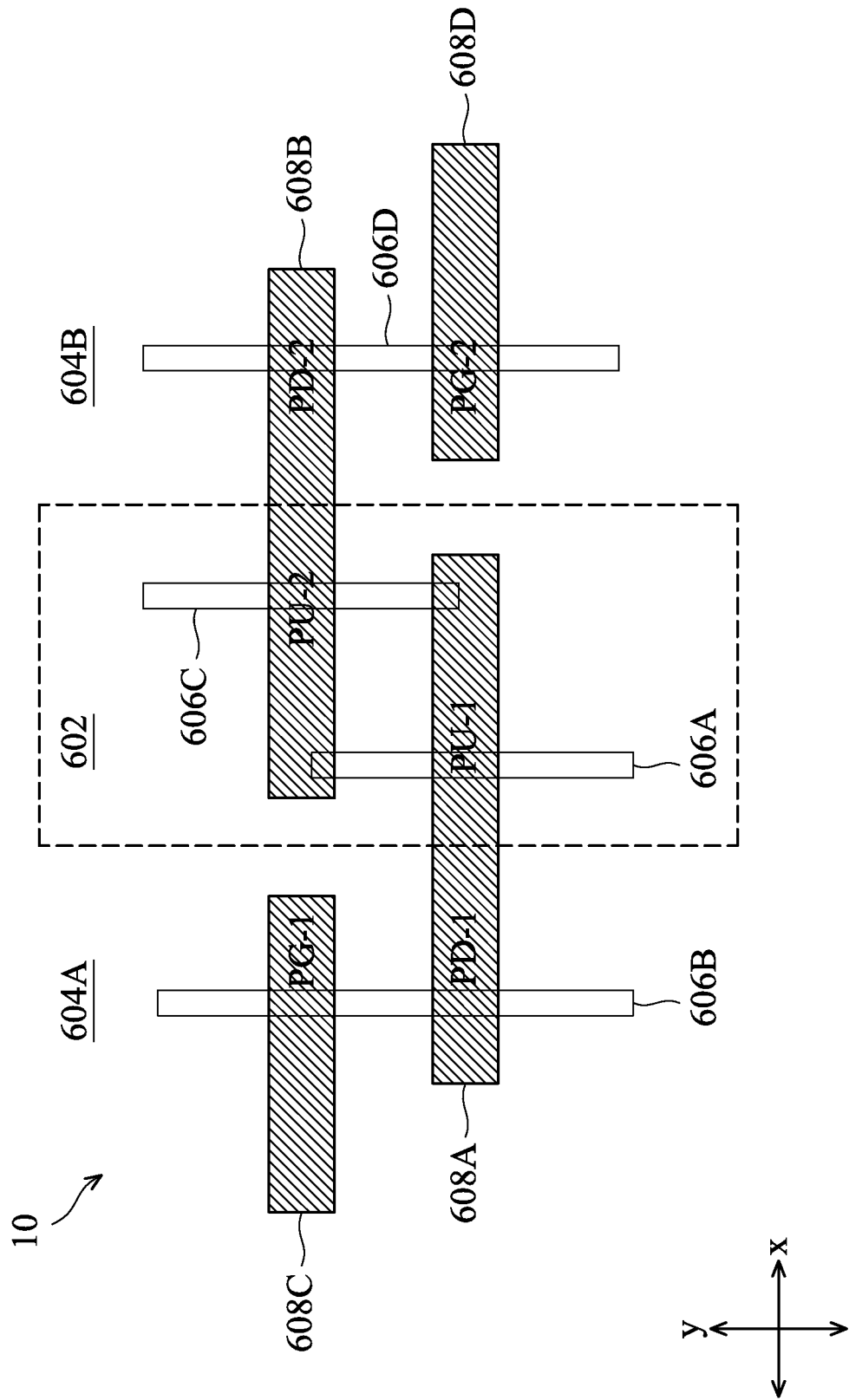
FIGS. 6A through 6E illustrate block diagrams of SRAM cell layouts in accordance with some embodiments.

Referring first to FIG. 6A, features in the OD level (FIG. 3) and overlying gate electrodes of various transistors in SRAM cell 10 are illustrated. An n-well region 602 is at the middle of SRAM cell 10, and two p-well regions 604A and 604B are on opposite sides of n-well region 602. Gate electrode 608A forms pull-up transistor PU-1 with an underlying active region 606A in n-well region 602. In an embodiment, active region 606A is fin-based and includes one or more fin structures disposed under gate electrode 608A (e.g., gate electrode 608A may be disposed over and extend along sidewalls of active region 606A). Gate electrode 608A further forms pull-down transistor PD-1 with underlying active region 606B in p-well region 604A (e.g., on a first side of n-well region 602). In an embodiment, active region 606B is fin-based and includes one or more continuous fin structures disposed under gate electrode 608A (e.g., gate electrode 608A may be disposed over and extend along sidewalls of active region 606B). Gate electrode 608C forms pass-gate transistor PG-1 with active region 606B. In an embodiment, gate electrode 608C is disposed over and extends along sidewalls of active region 606B As further illustrated by FIG. 6A, gate electrode 608B forms pull-up transistor PU-2 with an underlying active region 606C in n-well region 602. In an embodiment, active region 606C is fin-based and includes one or more fin structures disposed under gate electrode 608B (e.g., gate electrode 608B may be disposed over and extend along sidewalls of active region 606C). Gate electrode 608B further forms pull-down transistor PD-2 with an underlying active region 606D in p-well region 604B (e.g., on a second side of n-well region 602 opposing p-well region 604A). In an embodiment, active region 606D is fin-based and includes one or more fin structures disposed under gate electrode 608B (e.g., gate electrode 608B may be disposed over and extend along sidewalls of active region 606D). Gate electrode 608D forms pass-gate transistor PG-2 with underlying active region 606D. In an embodiment, gate electrode 608D is disposed over and extends along sidewalls of active region 606D.

In accordance with some embodiments of the present disclosure, pass-gate transistors PG-1 and PG-2, pull-up transistors PU-1 and PU-2, and pull-down transistors PD-1 and PD-2 are Fin Field-Effect Transistors (FinFETs) as described above where active regions 606A through 606D include one or more fin structures. In accordance with alternative embodiments of the present disclosure, one or more of the pass-gate transistors PG-1 and PG-2, pull-up transistors PU-1 and PU-2, and pull-down transistors PD-1 and PD-2 are planar MOS devices having active regions doped in an upper surface of a semiconductor substrate. Active regions 606 provide source/drains of various transistors on opposing sides of a respective gate electrode. FIG. 6A illustrates a single fin for each active region 606A through 606D in accordance with some embodiments. In accordance with other embodiments, there may be a single fin, two fins, three fins, or more for each active region 606A through 606D, and the number of fins in each active region 606A through 606D may be the same or different as other active regions in SRAM cell 10.

Figure 6B:
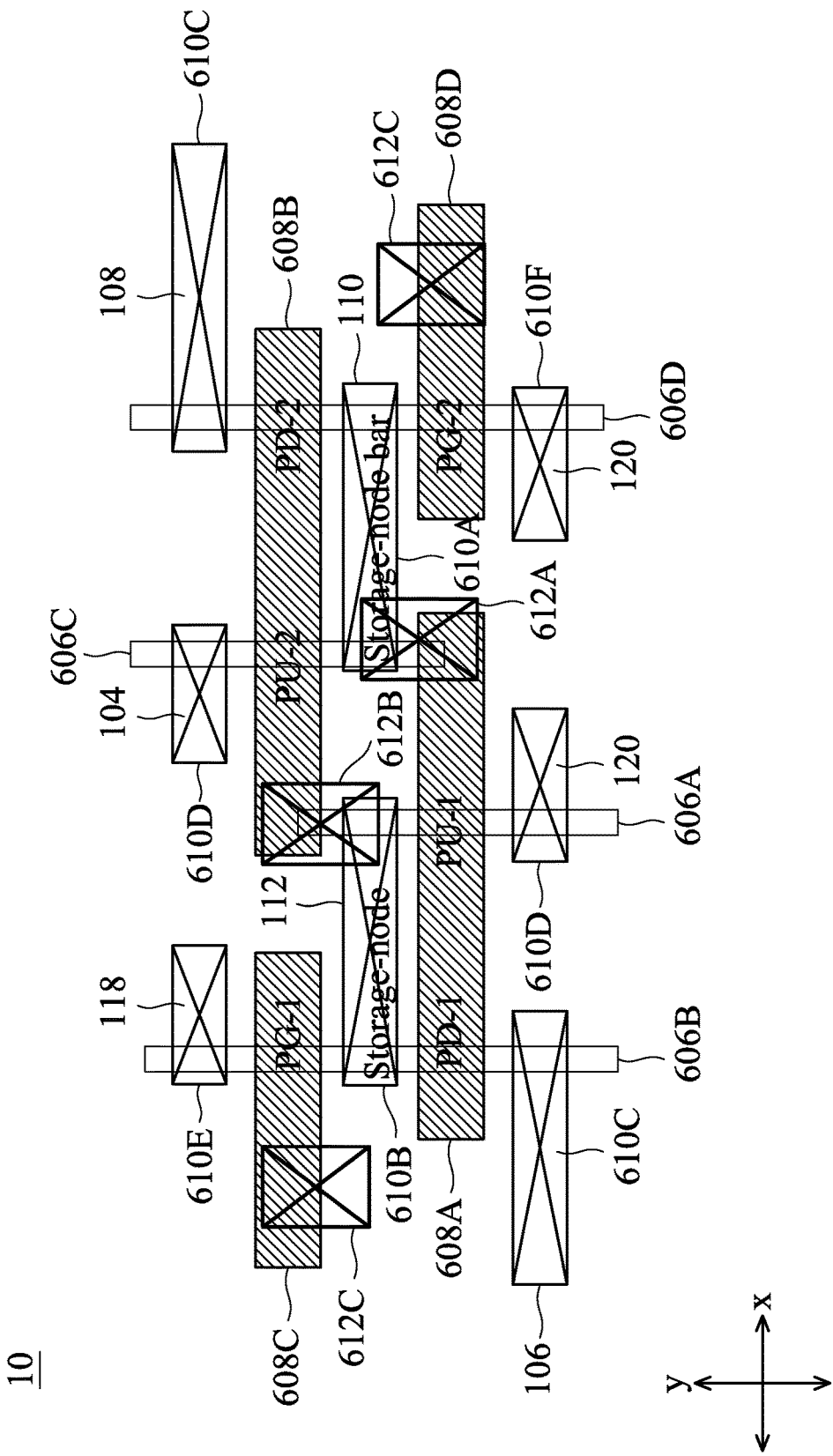

FIG. 6B illustrates features of SRAM cell 10 in the contact level (see FIG. 3) and lower. As shown in FIG. 6B, SD node 110 (see also FIG. 1) includes source/drain contact plug 610A and gate contact plug 612A, which are the features at the contact level of SRAM cell 10 (see FIG. 3). Source/drain contact plug 610A is elongated and has a longitudinal direction in the X direction, which is parallel to the extending directions of gate electrodes 608A and 608B. Gate contact plug 612A comprises a portion over, and is electrically connected to, gate electrode 608A. In accordance with some embodiments of the present disclosure, gate contact plug 612A has a longitudinal direction in the Y direction, with is perpendicular to the X direction. In the manufacturing of the SRAM cell 10 on physical semiconductor wafers, contact plugs 610A and 612A may be formed as a single continuous butted contact plug.

SD node 112 includes source/drain contact plug 610B and gate contact plug 612B. Gate contact plug 612B has a portion overlapping source/drain contact plug 610B. Since SD node 110 may be symmetric to SD node 112, the details of gate contact plug 612B and source/drain contact plug 610B may be similar to gate contact plug 612A and source/drain contact plug 610A, respectively, and are not repeated herein for simplicity.

FIG. 6B also illustrates gate contacts 612C connected to gate electrodes 608C and 608D, which may be used to electrically couple gate electrodes 608C and 608D to one or more WLs as described in greater detail below.

Furthermore, elongated contact plugs 610C are used to connect to the source regions of pull-down transistors PD-1 and PD-2 to CVss lines (e.g., electrical ground lines). Elongated contact plugs 610C are parts of the CVss nodes 106 and 108 (see also FIG. 1). Elongated contact plugs 610C have lengthwise directions parallel to the X direction, and may be formed to overlap the corners of SRAM cell 10. Furthermore, elongated contact plugs 610C may further extend into neighboring SRAM cells in a different column that abut SRAM cell 10 (see FIG. 6E). Elongated contact plugs 610C may further be shared between two neighboring SRAM cells in different rows that abut each other (see FIG. 6E).

Additionally, contact plugs 610D are used to connect to the source regions of pull-up transistors PU-1 and PU-2 to CVdd lines (e.g., supply voltage lines). Contact plugs 610D are parts of the CVdd nodes 102 and 104 (see also FIG. 1). Contact plugs 610D may further be shared between two neighboring SRAM cells in different rows that abut each other (see FIG. 6E).

As further illustrated by FIG. 6B, contact plugs 610E and 610F are used to connect to the source/drain regions of pass-gate transistors PG-1 and PG-2 to a BL and a BLB, respectively. Contact plugs 610E and 610F are parts of the BL node 118 and BLB node 120, respectively (see also FIG. 1). Contact plugs 610E and 610F may further be shared between two neighboring SRAM cells in different rows that abut each other (see FIG. 6E).

Figure 6C:
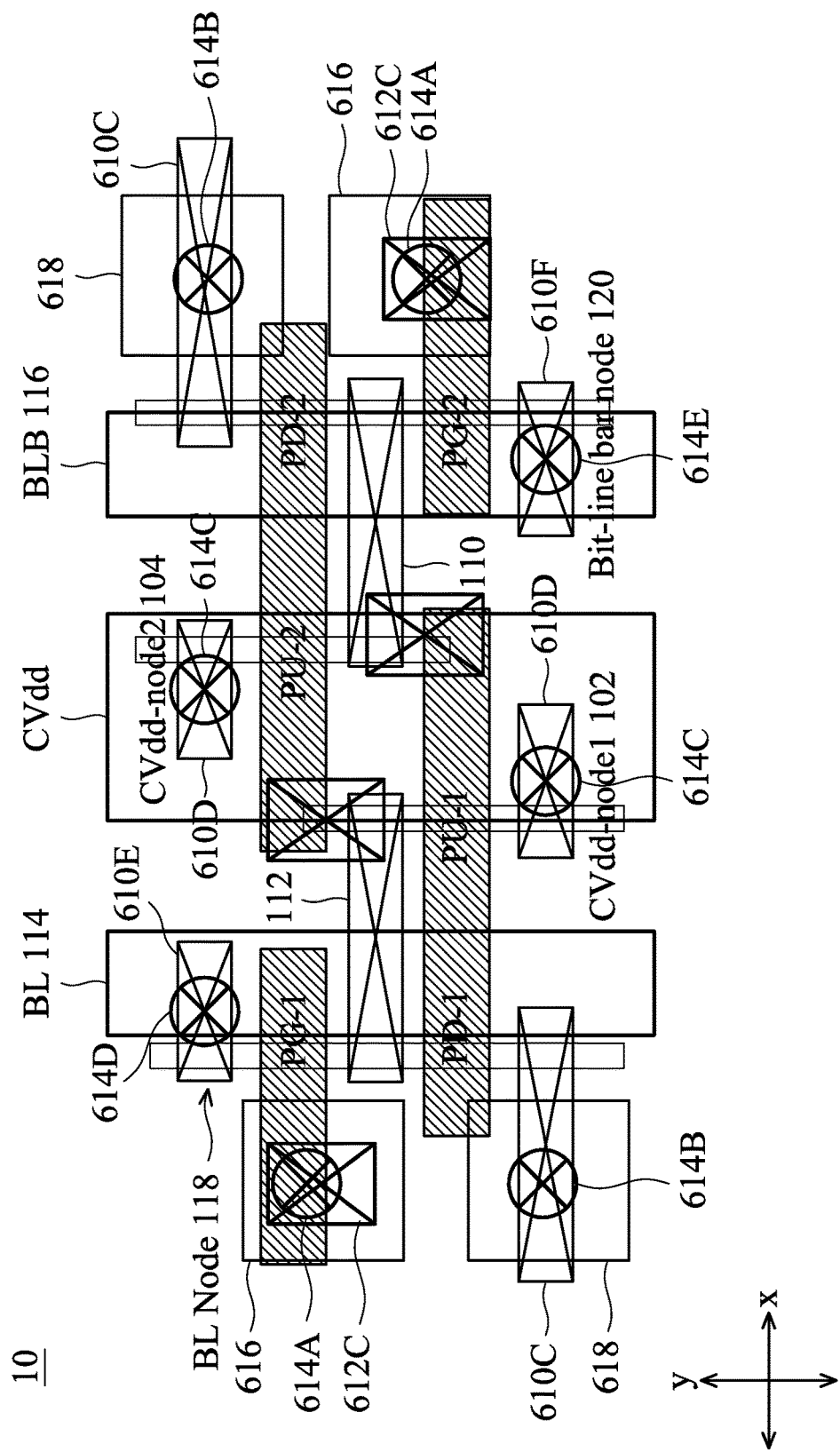

FIG. 6C illustrates features of SRAM cell 10 in the M1 and via_0 levels (see FIG. 3) and lower. In FIG. 6C, vias 614 (labeled 614A through 614E) are disposed in the via_0 level (see FIG. 3) while conductive lines 616, conductive lines 618, BL 114, CVdd line, and BLB line 116 are disposed in the M1 level (see FIG. 3). For example, various conductive lines in the M1 level are disposed over various vias in the via_0 level.

As shown in FIG. 6C, vias 614A are connected to gate contacts 612C (e.g., gate contacts for pass-gate transistors PG-1 of PG-2). Vias 614A are further connected to conductive lines 616, which may be used to electrically couple gate electrodes of pass gate transistors PG-1 and PG2 to one or more WLs as described in greater detail with respect to FIG. 6D below. Vias 614A and conductive lines 616 may further extend into and shared with neighboring SRAM cells in a different column that abut SRAM cell 10 (see FIG. 6E).

Furthermore, vias 614B are connected to elongated contact plugs 610C (e.g., source contacts of pull-down transistors PD-1 and PD-2). Vias 614B are further connected to conductive lines 618, which may be used to electrically couple sources of pull-down transistors PD-1 and PD2 to CVss lines as described in greater detail with respect to FIG. 6D below. Furthermore, vias 614B and conductive lines 618 may further extend into neighboring SRAM cells in a different column that abut SRAM cell 10 (see FIG. 6E). Vias 614B and conductive lines 618 may further be shared between two neighboring SRAM cells in different rows that abut each other (see FIG. 6E).

Additionally, vias 614C are connected to contact plugs 610D (e.g., source contacts of pull-up transistors PU-1 and PU-2). Vias 614C are further connected to a CVdd line, which electrically connects sources of pull-up transistors PU-1 and PU-2 to CVdd. Thus, vias 614C are parts of the CVdd nodes 102 and 104 (see also FIG. 1). Vias 614C may further be shared between two neighboring SRAM cells in different rows that abut each other (see FIG. 6E). In an embodiment, a single, continuous CVdd line is shared by all SRAM cells in a same column within an SRAM array, including SRAM cells in different SRAM mini arrays. In another embodiment, a continuous CVdd line is shared by SRAM cells in a same column within a single SRAM mini array, but SRAM cells in different SRAM mini arrays have different, physically separated CVdd lines (see e.g., FIG. 9).

As further illustrated by FIG. 6C, vias 614D and 614E are connected to contact plugs 610E and 610F (e.g., source/drain contacts of pass-gate transistors PG-1 and PG-2), respectively. Vias 614D and 614E are further connected to a BL 114 and a BLB 116, respectively. Thus, vias 614D and 614E are parts of the BL node 118 and BLB node 120, respectively (see also FIG. 1). Vias 614D and 614E may be shared between two neighboring SRAM cells in different rows that abut each other (see FIG. 6E). Furthermore, as described above, SRAM cells in a same column within an SRAM mini-array share a continuous BL and a continuous BLB. For example, the portion of BL 114 and BLB 116 in the illustrated SRAM cell 10 may be connected to portions of BL 114 and BLB 116 in other SRAM cells within the same column to form a continuous BL and a continuous BLB for each row of an SRAM mini array. However, source/drain contacts of pass-gate transistors of SRAM cells in different columns or different SRAM mini arrays are electrically connected to physically isolated BLs and BLBs (see e.g., FIG. 8).

Figure 6D:
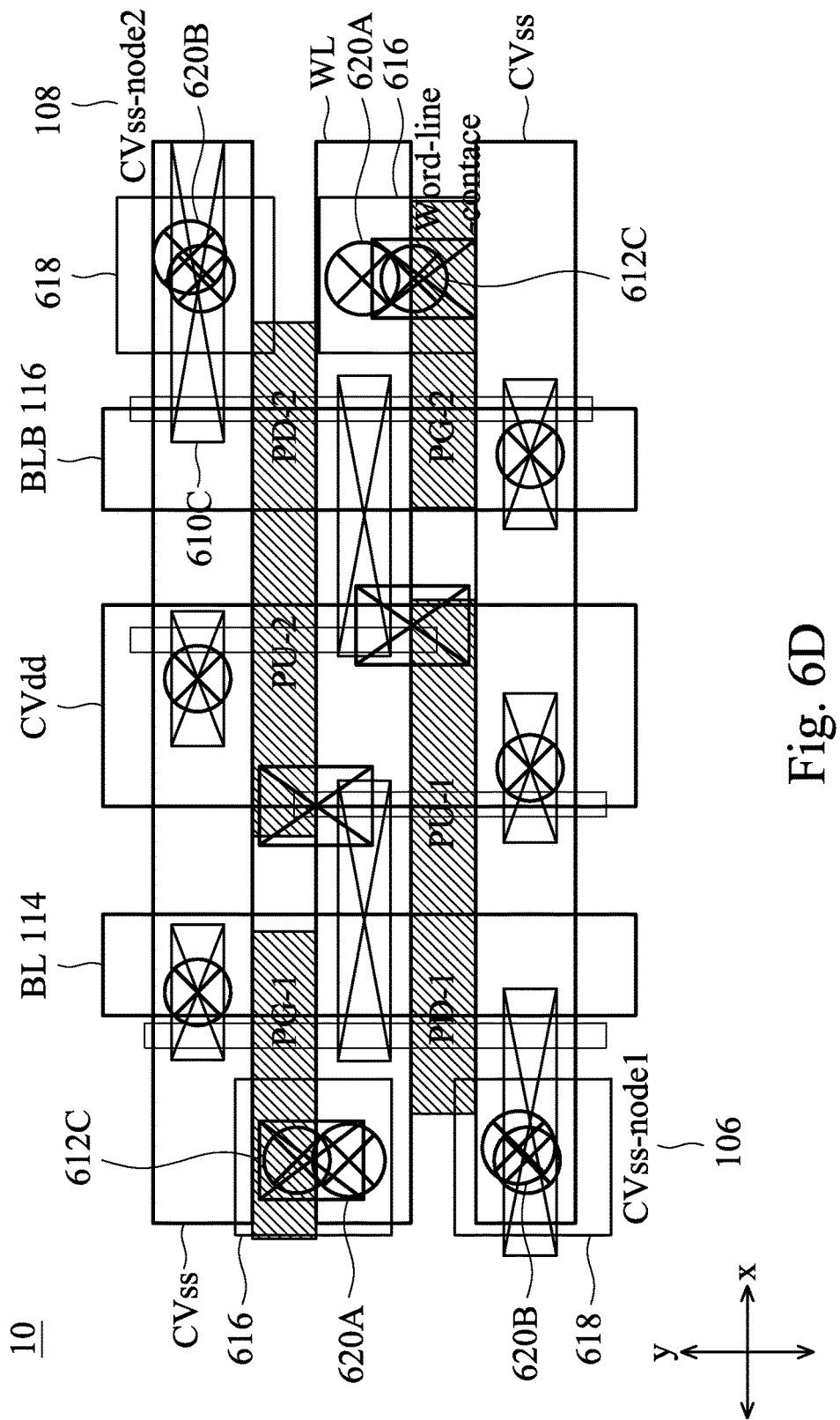

FIG. 6D illustrates features of SRAM cell 10 in the M2 and via_1 levels (see FIG. 3) and lower. In FIG. 6D, vias 620 (labeled 620A and 620B) are disposed in the via_1 level (see FIG. 3) while WLs and CVss lines are disposed in the M2 level (see FIG. 3). For example, various conductive lines in the M2 level are disposed over various vias in the via 1 level.

As shown in FIG. 6D, vias 620A are connected to conductive lines 616, which electrically connects gate contacts 612C (e.g., gate contacts for pass-gate transistors PG-1 of PG-2) to a WL. Thus, SRAM cell 10 includes WL nodes electrically connected to gates of pass-gate transistors. In an embodiment, SRAM cells in a same row share a common, continuous WL, which is used to select or deselect SRAM cells in an array. For example, in order to select a particular SRAM cell, a positive voltage may be applied to a BL/BLB as well as a WL corresponding to the cell. WL nodes may extend into and be shared with neighboring SRAM cells in a different column that abut SRAM cell 10 (see FIG. 6E).

Furthermore, vias 620B are connected to conductive lines 618, which electrically connects source contacts 610C (e.g., source contacts for pull-down transistors PD-1 or PD-2) to CVss lines. Thus, SRAM cell 10 includes CVss nodes 106 and 108 (see also FIG. 1), which include vias 620A. CVss nodes 106 and 108 may further extend into and shared with neighboring SRAM cells in a different column and/or row that abut SRAM cell 10 (see FIG. 6E). In an embodiment, SRAM cells in a same row share one or more continuous CVss lines.

Figure 6E:
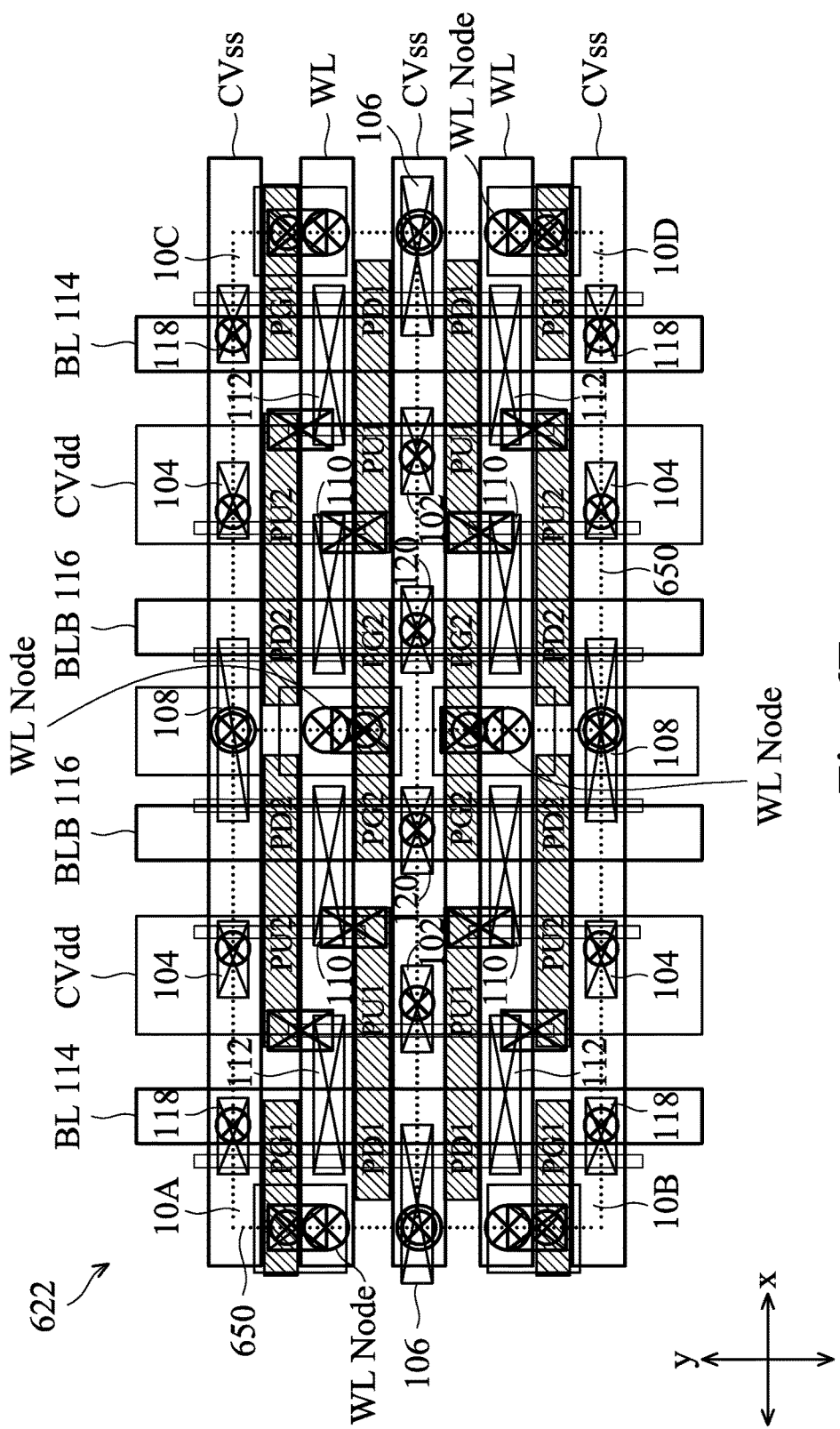

FIG. 6E illustrates multiple adjacent SRAM cells 10 (labeled SRAM cells 10A through 10D) arranged in a grid 622. In FIG. 6E, dotted lines 650 generally denote boundaries between SRAM cells. In various embodiments, the orientation of SRAM cells 10 may be varied to provide a grid 622 with improved symmetry and repeatability. In an embodiment, each SRAM mini array (e.g., SRAM mini arrays 202A and 202B, see FIG. 4) in an SRAM array includes multiple adjacent grids 622 to provide a desired number of rows and columns of SRAM cells 10.

In an embodiment, grid 622 is a 2×2 grid having four SRAM cells 10A, 10B, 10C, and 10D, each of which having a different orientation. SRAM cell 10A has a same orientation as described above with respect to FIGS. 6A through 6D. SRAM cell 10B is disposed in a same column but a different row than SRAM cell 10A. SRAM cell 10B is a mirror image of SRAM cell 10A flipped vertically across a boundary in the X direction (e.g., in a direction along a lengthwise direction of a WL) between SRAM cells 10A and 10B. SRAM cell 10C is disposed in a same row but a different column than SRAM cell 10A. SRAM cell 10C is a mirror image of SRAM cell 10A flipped horizontally across a boundary in the Y direction (e.g., in a direction along a lengthwise direction of a BL) between SRAM cells 10A and 10C. SRAM cell 10D is disposed in a same row as SRAM cell 10B and a same column as SRAM cell 10C. SRAM cell 10D is a mirror image of SRAM cell 10B flipped horizontally across a boundary in the Y direction (e.g., in a direction along a lengthwise direction of a BL) between SRAM cells 10D and 10B. SRAM cell 10D is further a mirror image of SRAM cell 10C flipped vertically across a boundary in the X direction (e.g., in a direction along a lengthwise direction of a WL) between SRAM cells 10D and 10B.

Each SRAM cell 10A through 10D includes individual SD nodes 110 and 112, which store complementary bits. However, adjacent SRAM cells 10A through 10D may share nodes at a boundary between the adjacent SRAM cells 10A through 10D. For example, SRAM cells 10A and 10B share common WL nodes (e.g., a WL node of pass-gate transistors PG-2) and CVss nodes 108 with a respective adjacent SRAM cell 10C and 10D. SRAM cells 10A and 10B may further share a common gate electrode for pass-gate transistors PG-2 with a respective adjacent SRAM cell 10C and 10D. As another example, SRAM cells 10A and 10C share common CVss nodes 106, CVdd nodes 102, and BLB nodes 120 with a respective adjacent SRAM cell 10B and 10D.

Although not explicitly illustrated, each SRAM cell 10A through 10D may further share other features at a boundary between other adjacent SRAM cells (not illustrated) in SRAM array 200. For example, SRAM cells 10A may share a common WL node (e.g., a WL node of pass-gate transistor PG-1), a common CVss nodes 106, and a common gate electrode for pass-gate transistor PG-1 with an adjacent SRAM cell in a same row and to the left of SRAM cell 10A (not explicitly illustrated). As another example, SRAM cells 10A may share a common CVss node 108, CVdd node 104, and WL node with an adjacent SRAM cell in a same column and above SRAM cell 10A (not explicitly illustrated).

The layout of grid 622 may be repeated to provide a SRAM mini array (e.g., SRAM mini array 202A or 202B) of any desired size. As illustrated in FIG. 6E, SRAM cells 10 within in a same column and mini array share a continuous BL 114, a continuous CVdd line, and a continuous BLB 116. Similarly, SRAM cells 10 within a same row share continuous WL and a continuous CVss. By providing different orientations of SRAM cells 10 in an SRAM array, a symmetrical grid may be repeated to form an SRAM array of any desired size. Due to the symmetry of features in grid 622, common features between adjacent SRAM cells may be co-located, which advantageously reduces the overall footprint of an SRAM array in a semiconductor chip.

Figure 7A:
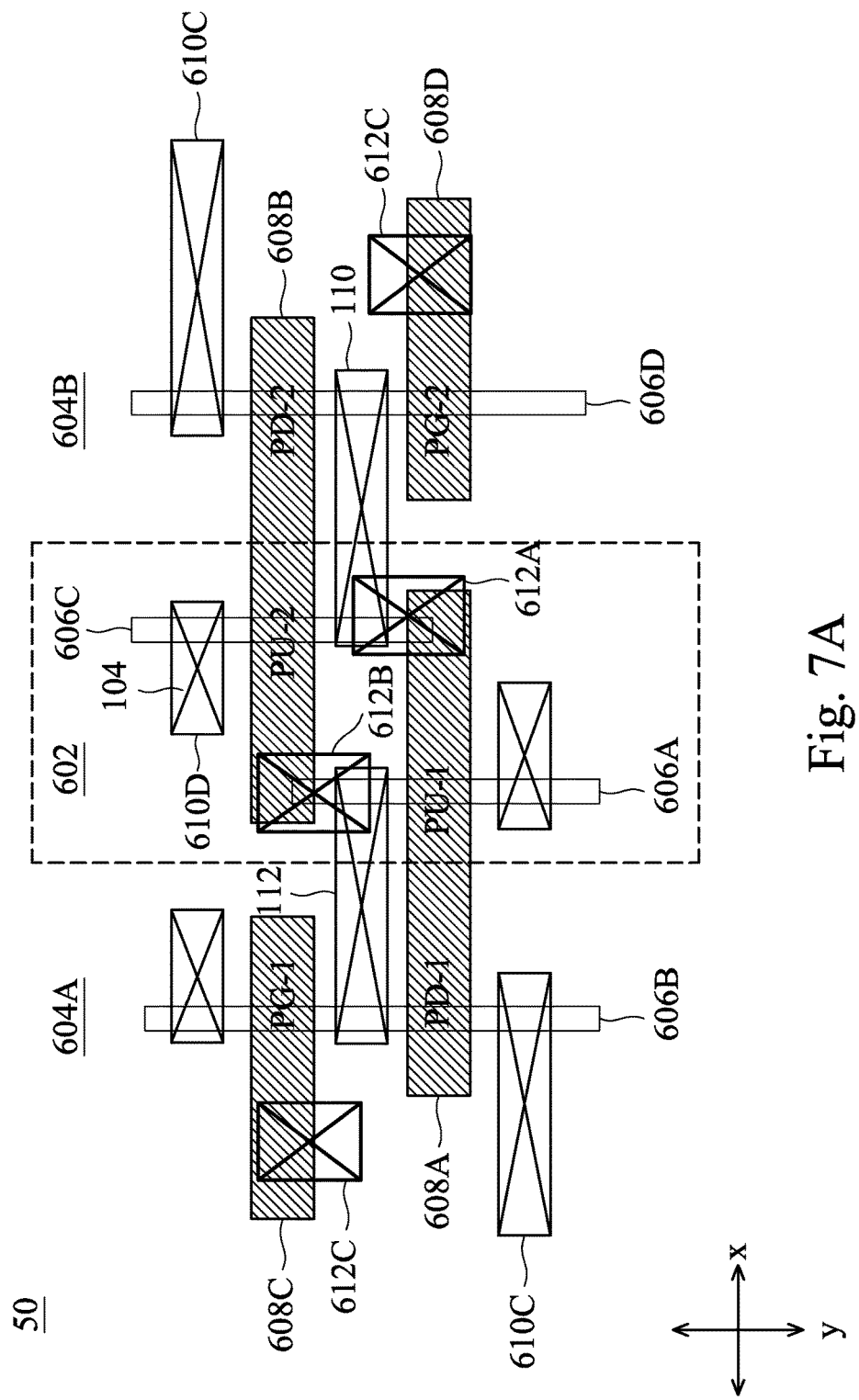
FIGS. 7A through 7E illustrate block diagrams of SRAM array abut dummy cell layouts in accordance with some embodiments.
Figure 7B:
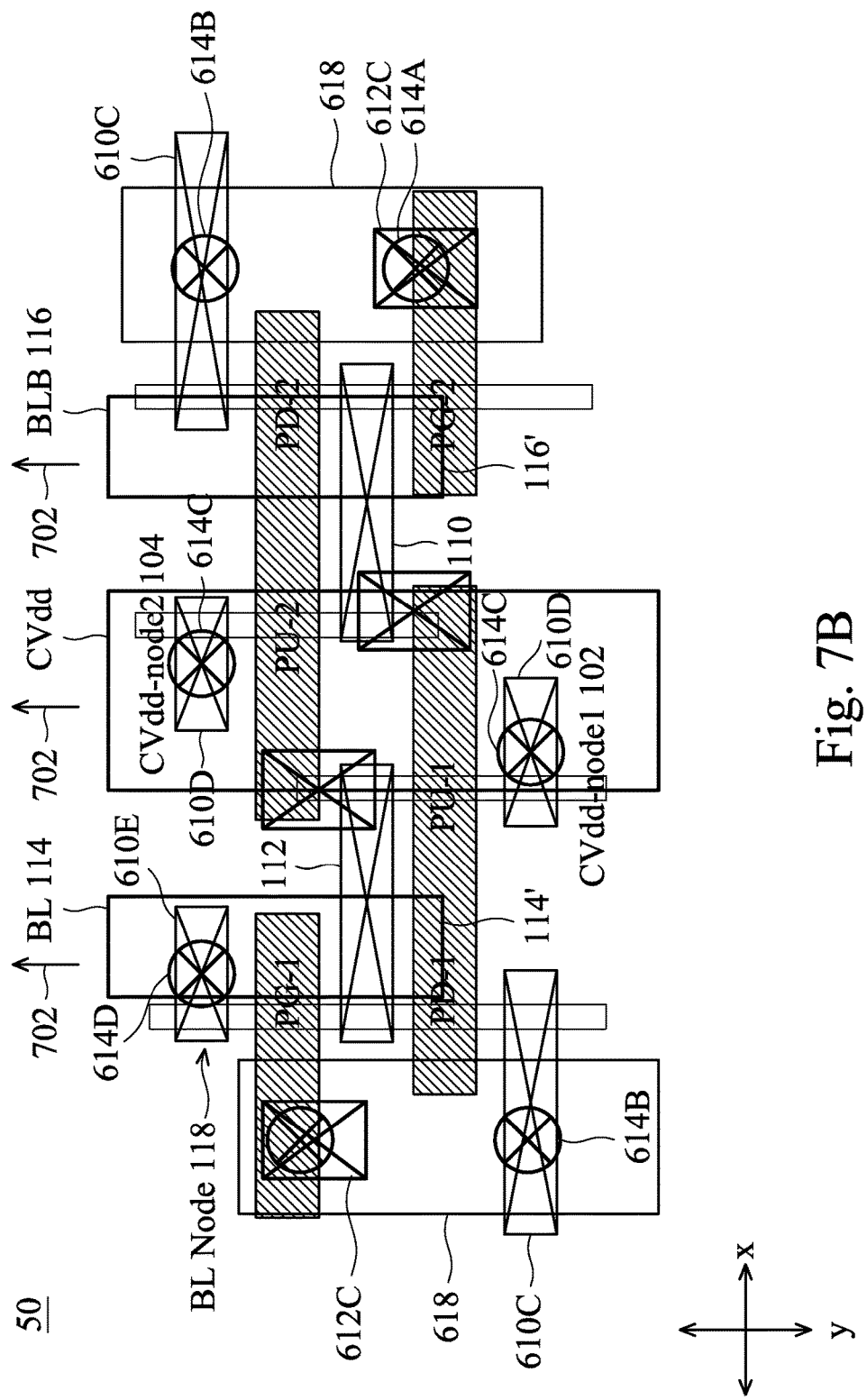
Figure 7C:
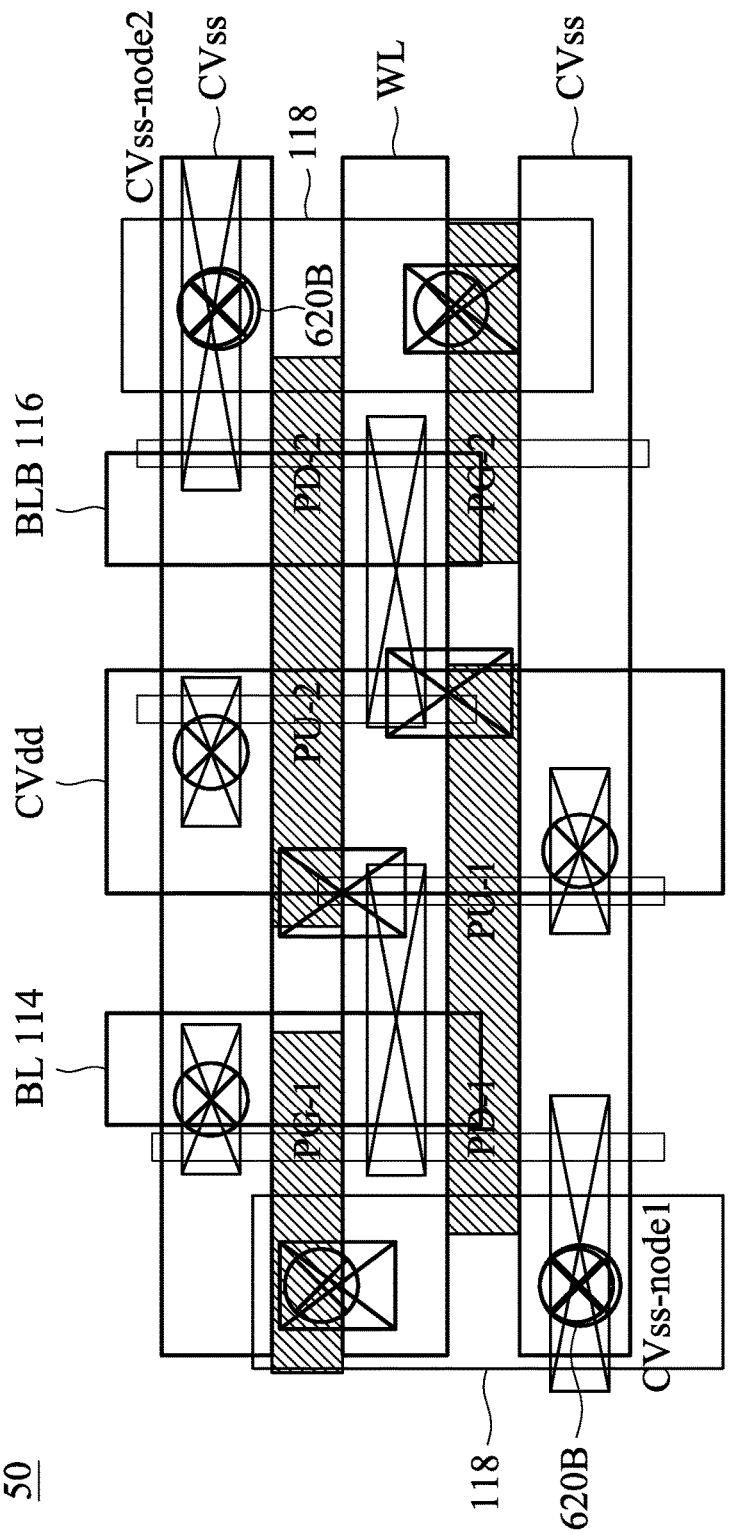

FIGS. 7A through 7C illustrate block diagrams of a layout of features of a dummy memory cell (e.g., SRAM array abut dummy cells 50) according to some embodiments. FIGS. 7A through 7C illustrates features in different levels of SRAM array abut dummy cells 50 (e.g., OD level, contact level, via_0 level, M1 level, via-1 level, M2 level in FIG. 3), which are consecutively described for clarity.

Referring first to FIG. 7A, features in the OD level, overlying gate electrodes, and the contact level of various transistors (see FIG. 3) in SRAM array abut dummy cells 50 are illustrated. The various features in the OD level, via_0 level gate electrodes of SRAM array abut dummy cells 50 may be the same as SRAM cell 10 where like reference numbers indicate like elements. For example, SRAM array abut dummy cells 50 includes pass-gate transistors PG-1 and PG-2, pull-up transistors PU-1 and PU-2, and pull-down transistors PD-1 and PD-2. Gates and drains of pull-up transistor PU-1/pull-down transistor PD-1 are electrically connected to respective drains and gates of pull-up transistor PU-2/pull-down transistor PD-2 to provide SD nodes 110 and 112. Additional source/drain contacts and gate contacts as described above are also provided to various active regions/gate electrodes of transistors in SRAM array abut dummy cells 50. Furthermore, in some SRAM array abut dummy cells 50, source/drain contacts to pass gate transistor PG-2 to form BLB node 120 may be omitted as explained in greater detail below. Thus, further description of such features is omitted for brevity.

FIG. 7B illustrates features of SRAM array abut dummy cells 50 in the M1 and via_0 levels (see FIG. 3) and lower. In FIG. 7B, vias 614 (labeled 614A through 614E) are disposed in the via_0 level (see FIG. 3) while conductive lines 616, conductive lines 618, BL 114, CVdd line, and BLB line 116 are disposed in the M1 level (see FIG. 3). For example, various conductive lines in the M1 level are disposed over various vias in the via_0 level.

In various embodiments, features of SRAM array abut dummy cells 50 in the M1 and via_0 levels may be similar to corresponding features in SRAM cell 10 where like reference numerals indicate like elements. For example, vias 614C are connected to contact plugs 610D (e.g., source contacts of pull-up transistors PU-1 and PU-2). Vias 614C are further connected to a CVdd line (e.g., supply voltage line), which electrically connects sources of pull-up transistors PU-1 and PU-2 to CVdd. Thus, vias 614C are parts of the CVdd nodes 102 and 104 (see also FIG. 1).

As illustrated, vias 614A are connected to gate contacts 612C (e.g., gate contacts for pass-gate transistors PG-1 of PG-2). Vias 614A are connected to conductive lines 618, which may be used to electrically couple gate electrodes of pass gate transistors PG-1 and PG2 directly to CVss lines (e.g., electrical ground) as described in greater detail with respect to FIG. 7C below. Furthermore, vias 614B are connected to elongated contact plugs 610C (e.g., source contacts of pull-down transistors PD-1 and PD-2). Vias 614B are further connected to the same conductive lines 618 as vias 614A, which may be used to electrically couple sources of pull-down transistors PD-1 and PD2 to CVss lines in the M2 level (see FIGS. 3 and 7C).

Endpoints of BL 114 and BLB 116 are disposed in SRAM array abut dummy cells 50. For example, endpoint 114' of BL 114 and endpoint 116' of BLB 116 may be disposed in SRAM array abut dummy cells 50. In various embodiments, BL 114, CVdd line, and BLB 116 may extend into and be shared by SRAM cells 10 (not illustrated) in a same column as SRAM array abut dummy cells 50 (see FIG. 8) as indicated by arrows 702.

As further illustrated by FIG. 7B, via 614D is connected to contact plug 610E (e.g., source/drain contact of pass-gate transistor PG-1), which is connected to BL 114. Thus, via 614D is part of the BL node 118. In the illustrated embodiment, BLB 116 may terminate prior to a source/drain contact of pass-gate transistor PG-2, and BLB 116 is not electrically connected to any features in SRAM array abut dummy cell 50. As SRAM array abut dummy cells 50 is permanently deselected and non-operational to store data, the lack of connection with BLB 116 is not a concern. In other embodiments BLB 116 may be electrically connected a source/drain region of pass-gate transistor PG-2 in a similar manner as SRAM cell 10 (see e.g., FIGS. 6C and 7E).

FIG. 7C illustrates features of SRAM array abut dummy cells 50 in the M2 and via_1 levels (see FIG. 3) and lower. In FIG. 7C, vias 620 (labeled 620A and 620B) are disposed in the via_1 level (see FIG. 3) while WLs and CVss lines are disposed in the M2 level (see FIG. 3). For example, various conductive lines in the M2 level are disposed over various vias in the via_1 level.

In various embodiments, features of SRAM array abut dummy cells 50 in the M2 and via_2 levels may be similar to corresponding features in SRAM cell 10 where like reference numerals indicate like elements. For example, vias 620B are connected to conductive lines 618, which electrically connects source contacts 610C (e.g., source contacts for pull-down transistors PD-1 or PD-2) to CVss lines. As discussed above, in SRAM array abut dummy cells 50, conductive lines 618 are also electrically connected to gates of pass-gate transistors PG-1 and PG-2. Thus, vias 620B may further be used to directly connect gates of pass-gate transistors PG-1 and PG-2 to CVss, which permanently deselects SRAM array abut dummy cells 50. Furthermore, vias 620A (see FIG. 6D), which provides electrical contact to the WL may be omitted from SRAM array abut dummy cells 50. However, a WL may still be disposed in SRAM array abut dummy cells 50 for improved pattern uniformity in the M2 level. In another embodiment, the WLs may be replaced with conductive lines to serve as cell Vss connections as explained in greater detail with respect to FIGS. 9 and 10 below.

Figure 7D:
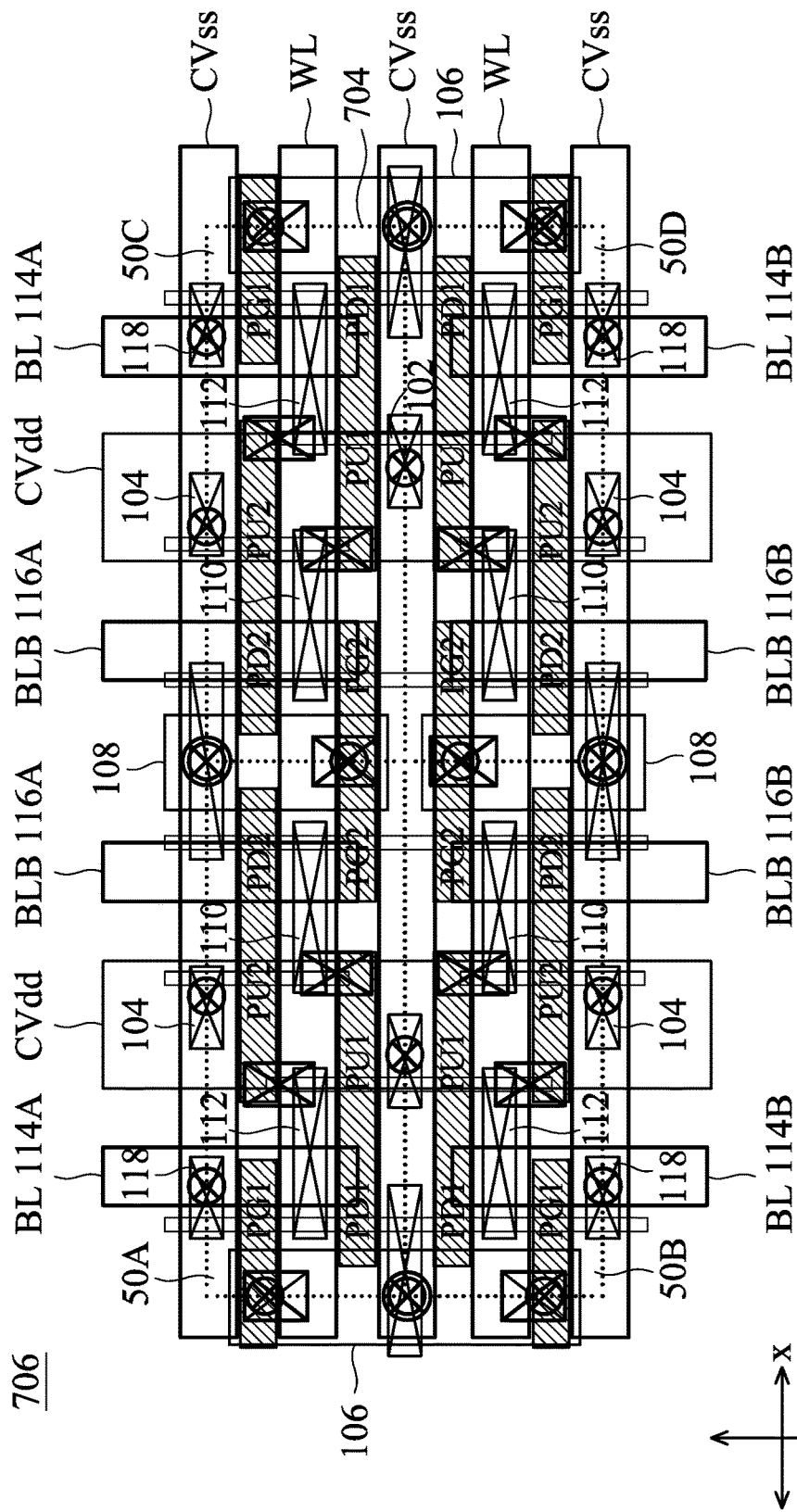

FIG. 7D illustrates multiple adjacent SRAM array abut dummy cells 50 (labeled SRAM array abut dummy cells 50A through 50D) arranged in a grid 706. In FIG. 7D, dotted lines 704 generally denote boundaries between SRAM cells. In various embodiments, the orientation of SRAM array abut dummy cells 50 may be varied to match the symmetry of SRAM cells 10 in SRAM mini arrays abutting SRAM array abut dummy cells 50 (e.g., see FIG. 6E and FIG. 8). In an embodiment, a SRAM dummy array (e.g., SRAM dummy array 204, see FIG. 4) includes multiple adjacent grids 706 to provide two or more rows of SRAM array abut dummy cells 50.

In an embodiment, grid 706 is a 2×2 grid having four SRAM array abut dummy cells 50A, 50B, 50C, and 50D, each of which having a different orientation. In an embodiment, SRAM array abut dummy cell 50A has a same orientation as SRAM cell 10A (see FIG. 6E); SRAM array abut dummy cell 50B has a same orientation as SRAM cell 10B (see FIG. 6E); SRAM array abut dummy cell 50C has a same orientation as SRAM cell 10C (see FIG. 6E); and SRAM array abut dummy cell 50D has a same orientation as SRAM cell 10D (see FIG. 6E). For example, the orientation of SRAM array abut dummy cell 50B is a mirror image of SRAM array abut dummy cell 50A flipped vertically across a boundary in the X direction. The orientation of SRAM array abut dummy cell 50C is a mirror image of SRAM array abut dummy cell 50A flipped horizontally across a boundary in the Y direction. The orientation of SRAM array abut dummy cell 50D is a mirror image of SRAM array abut dummy cell 50C flipped horizontally across a boundary in the Y direction.

Adjacent SRAM array abut dummy cell 50A through 50D may share nodes at a boundary between the adjacent SRAM array abut dummy cell 50A through 50D. For example, SRAM array abut dummy cell 50A and 50B share common CVss nodes 108 with a respective adjacent SRAM array abut dummy cell 50C and 50D. As another example, SRAM array abut dummy cells 50A and 50C share common CVss nodes 106, CVdd nodes 102, and BLB nodes 120 with a respective adjacent SRAM array abut dummy cells 50B and 50D.

Although not explicitly illustrated, each SRAM array abut dummy cell 50A through 50D may further share other features at a boundary between other adjacent functional SRAM cells (not illustrated) and SRAM array abut dummy cells (not illustrated) in SRAM array 200. In an embodiment, grid 706 may directly abut SRAM cells 10 in different rows and directly abut SRAM array abut dummy cells in different columns (see e.g., FIG. 4 where grid 706 is part of SRAM dummy array 204). SRAM array abut dummy cell may share a common CVss nodes 106 with adjacent SRAM array abut dummy cells 50 to the left/right of grid 706 (not explicitly illustrated). Furthermore, SRAM array abut dummy cell 50 may share a common CVss node 108, CVdd node 104, and WL node with adjacent SRAM cells 10 (not explicitly illustrated) in a same column and above/below of grid 706 (not explicitly illustrated).

As illustrated by FIG. 7D, BLs 114 and BLBs 116 in a SRAM array terminate in SRAM array abut dummy cells 50. For example, BLs 114A and BLBs 116A terminate in SRAM array abut dummy cells 50A and 50C while BLs 114B and BLBs 116B terminate in SRAM array abut dummy cells 50B and 50D. Thus, even though SRAM array abut dummy cells 50A and 50B (or 50C and 50D) are disposed in a same column, BL 114A/BLB 116A in SRAM array abut dummy cell 50A (or 50C) is physically isolated from BL 114B/BLB 116B in SRAM array abut dummy cells 50B (or 50D). Furthermore, BLs 114A/BLBs 116A may extend into and used to select SRAM cells in a first SRAM mini array (e.g., SRAM mini array 202A) while BLs 114B/BLBs 116B may be disposed into and used to select SRAM cells in a second SRAM mini array (e.g., SRAM mini array 202B). BLs 114A/BLBs 116A may also be controlled by independent control circuitry (e.g., control circuitry 206A) from the control circuitry (e.g., control circuitry 206B) controlling BLs 114B/BLBs 116B.

Because the layout of grid 706 is similar to the layout of grid 622 (e.g., having functional SRAM cells 10), grid 706 may directly abut functional SRAM mini arrays. Thus, SRAM mini arrays may be deployed in close proximity on an integrated circuit die while still maintaining independent BLs, BLBs, and control circuitry. Furthermore, in an embodiment the size of each SRAM array abut dummy cell 50 is the same as a functional SRAM cell 10 (see FIG. 6E), which provides increased ease in layout integration and planning. Thus, a larger number of functional SRAM cells in a semiconductor chip is provided while reducing the risk of overloading a control circuit and having a relatively small footprint.

Figure 7E:
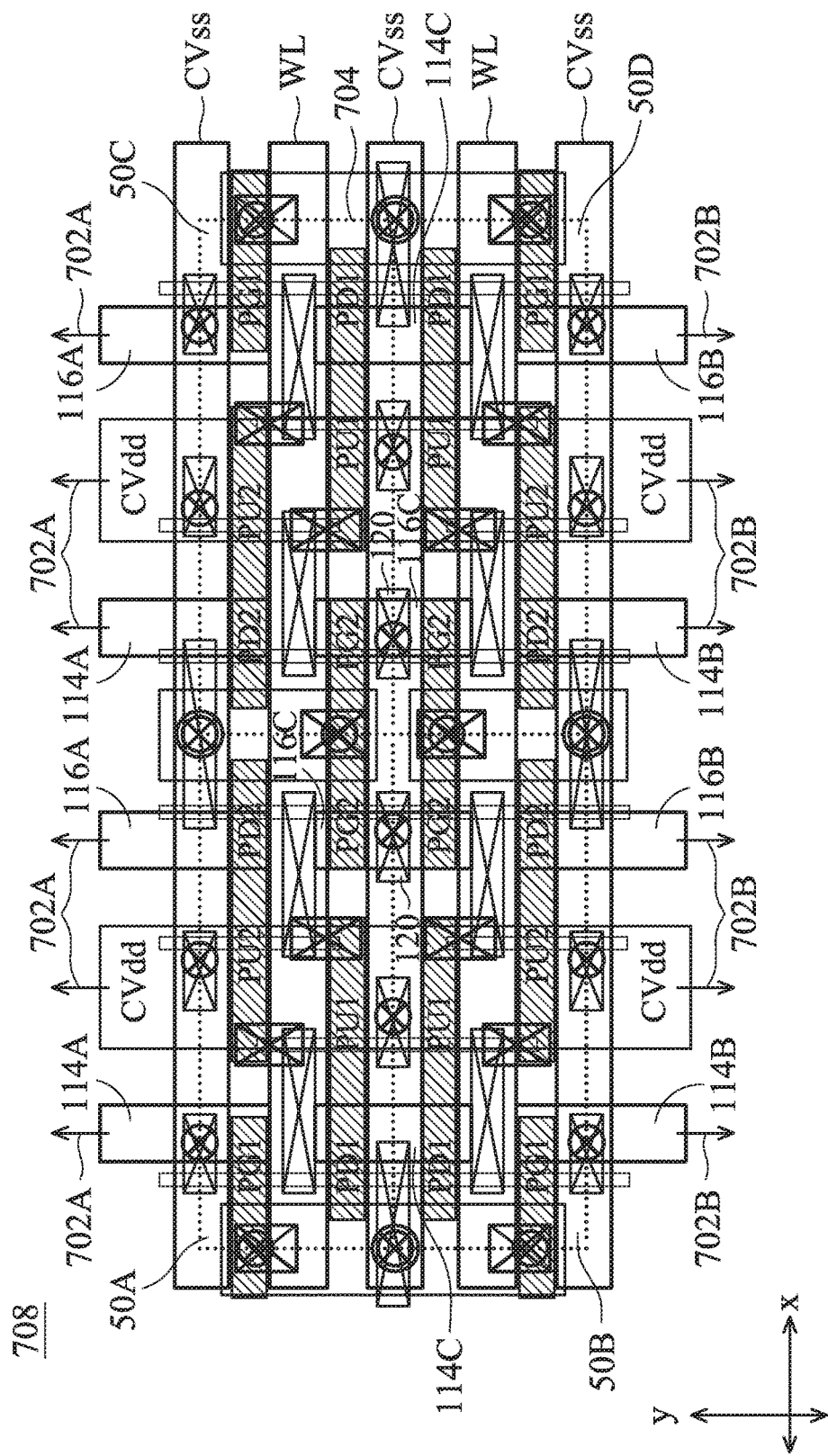

FIG. 7E illustrates multiple adjacent SRAM array abut dummy cells 50 (labeled SRAM array abut dummy cells 50A through 50D) arranged in a grid 708 according to another embodiment. Grid 708 may be similar to grid 706 where like reference numerals indicate like elements. In FIG. 7E, BLs 114A/BLB 116A extend into an adjacent first SRAM mini array as indicated by arrows 702A, and BLs 114A/BLBs 116A used to select/deselect functional SRAM cells 10 in the first SRAM mini array. Similarly, BLs 114B/BLBs 116A extend into an adjacent second SRAM mini array as indicated by arrows 702B, and BLs 114B/BLBs 116B used to select/deselect functional SRAM cells 10 in the second SRAM mini array. BLs 114A and BLBs 116B are physically separated from BLs 114B and BLBs 116B. Furthermore, in grid 708, BLs 114C and BLBs 116C are disposed between respective ones of BLs 114A/BLs 114B and BLBs 116A/BLBs 116B in a same column. As illustrated, BLs 114C and BLBs 116C may span between two adjacent SRAM array abut dummy cells 50 in a same column (e.g., cells 50A/50B or cells 50C/50D), and an entirety of each BL 114C/BLB 116C may be disposed in adjacent SRAM array abut dummy cells 50 in a same column (e.g., cells 50A/50B or cells 50C/50D). In FIG. 7E, some BLB 116C are electrically connected to a BLB node 120 of SRAM array abut dummy cells 50A through 50D.

Figure 8:
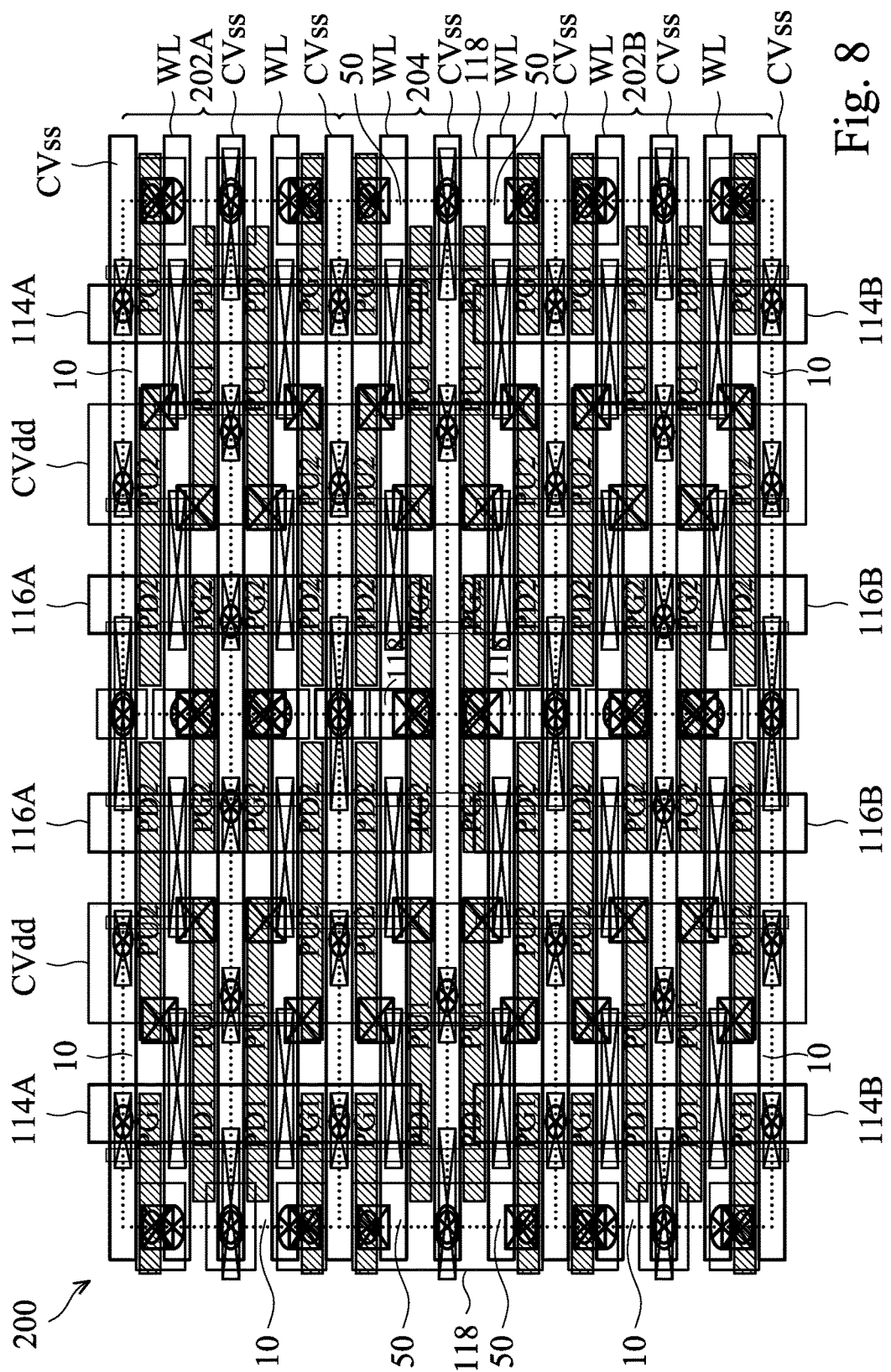
FIG. 8 illustrates a block diagram of an SRAM array layout in accordance with some embodiments.

FIG. 8 illustrates portions of an SRAM array 200 having an SRAM mini array 202A, a SRAM dummy array 204 adjacent SRAM mini array 202A, and a SRAM mini array 202B adjacent SRAM dummy array 204. SRAM dummy array 204 is disposed between and abuts SRAM mini arrays 202A and 202B. In FIG. 8, SRAM mini arrays 202A and 202B include functional SRAM cells arranged as a grid 622 (see FIG. 6E). SRAM dummy array 204 includes SRAM array abut dummy cells 50 arranged as a grid 706 (see FIG. 7D). SRAM cells 10 in a same column in SRAM mini array 202A share a common BL 114A and BLB 116A. SRAM cells 10 in a same column in SRAM mini array 202B share a common BL 114B and BLB 116B. Endpoints of BLs 114A are disposed in SRAM dummy array 204, and BLs 114A are physically separated from BLs 114B. Similarly, endpoints of BLBs 116B are disposed in SRAM dummy array 204, and BLBs 116A are physically separated from BLBs 116B. BLs 114A/BLBs 116A may be controlled by independently from BLs 116A/BLBs 116B. Thus, SRAM dummy array 204 can be used to adjoin two SRAM mini arrays to create an SRAM array with a greater number of SRAM cells without the risk over overloading BLs/BLBs with too many SRAM cells in a single column.

Furthermore, in SRAM array 200, CVdd lines are continuous in all cells in a same column. For example, a single continuous CVdd line is disposed across each column of SRAM array 200 (e.g., across cells of SRAM mini array 202A, SRAM dummy array 204, and SRAM mini array 202B). In another embodiment, CVdd lines in SRAM mini array 202A may be physically separated from CVdd lines in SRAM mini 202B as illustrated in FIGS. 9 and 10.

Figure 9:
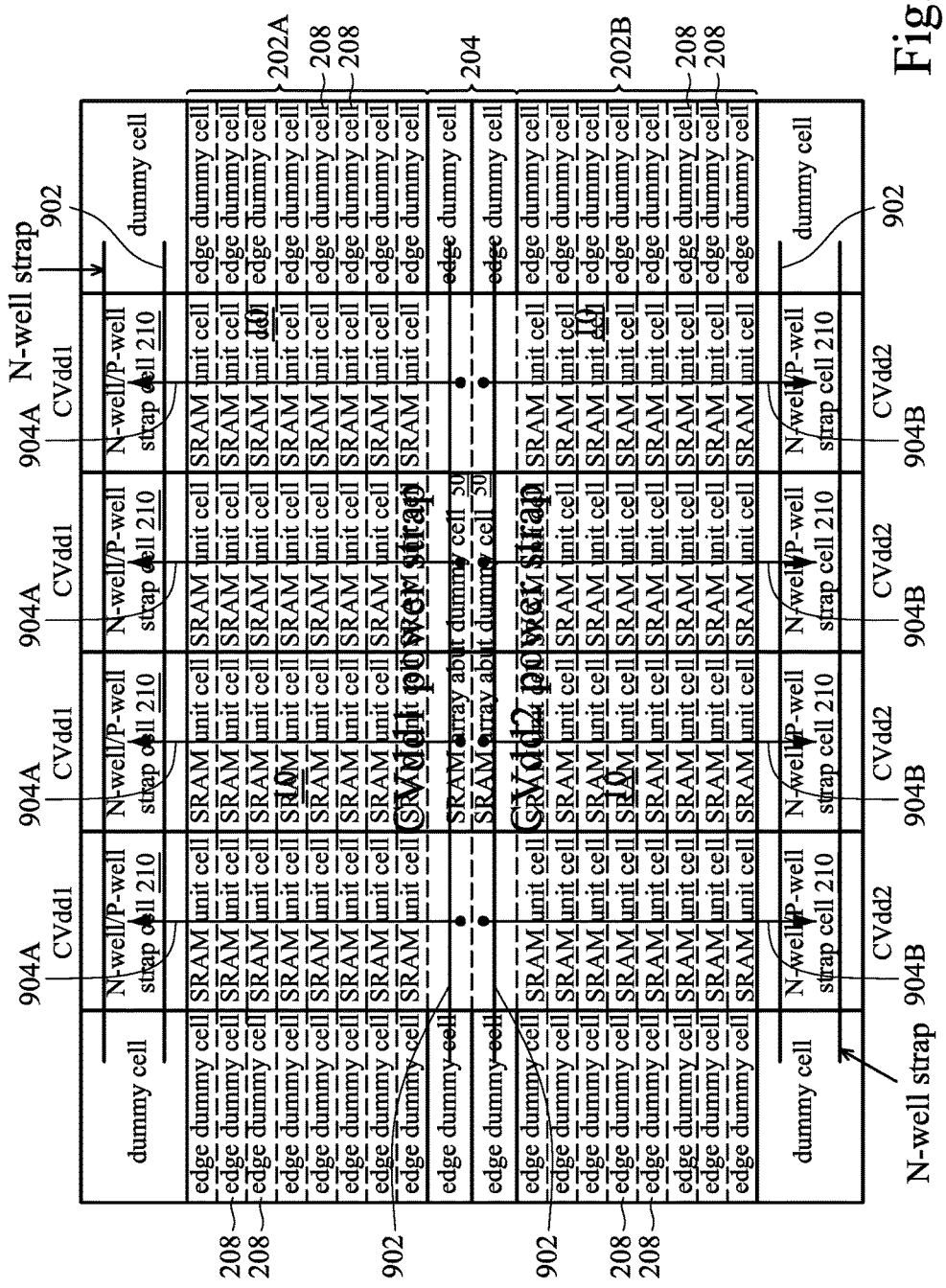
FIG. 9 illustrates a block diagram of an SRAM array in accordance with some other embodiments.

FIG. 9 illustrates a block diagram of an embodiment SRAM array 900. SRAM array 900 may be similar to SRAM array 200 (see FIG. 4) where like reference numerals indicate like elements. For example, SRAM array 900 includes at least two SRAM mini arrays 202A and 202B and a SRAM dummy array 204 between and adjoining SRAM mini arrays 202A and 202B. SRAM arrays 202A/202B include functional SRAM cells 10 arranged in any number of rows and columns. SRAM dummy array 204 includes two or more rows of SRAM array abut dummy cells 50. Unlike SRAM array 200, CVdd lines 904A and 904B in SRAM array 900 terminate in SRAM dummy array 204. CVdd lines 904A and 904B may be electrically connected to additional supply voltage lines 902, which may run in a perpendicular direction to CVdd lines 904A and 904B. Supply voltage lines 902 allow CVdd lines 904A to be independently powered from CVdd lines 904B. Thus, CVdd lines 904A in SRAM mini array 202A are physically isolated from CVdd lines 904B, and SRAM mini array 202A may be independently operated and powered separately from SRAM mini array 202B. Power savings and improved reliability may be provided in such embodiments.

Figure 10:
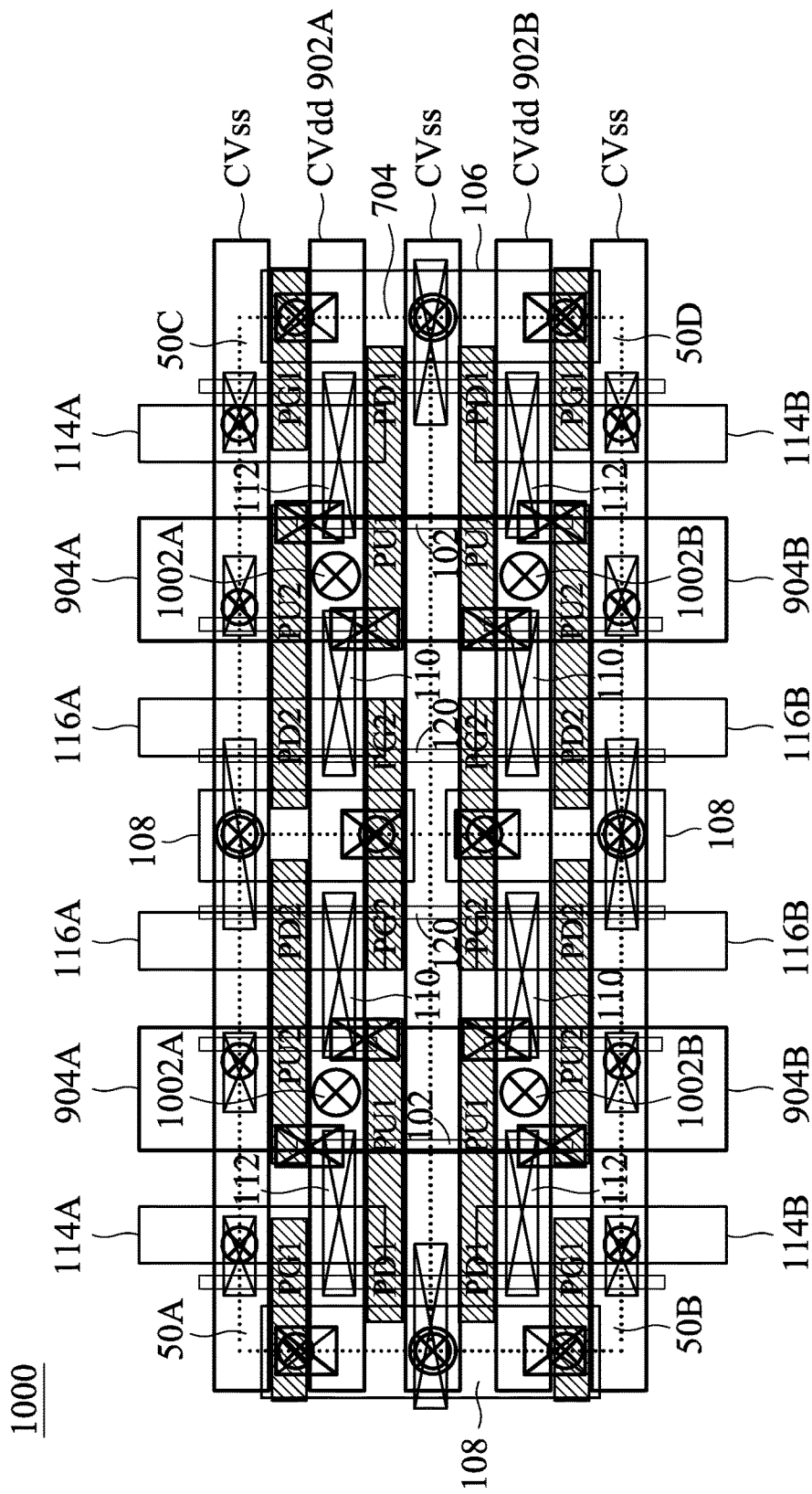
FIG. 10 illustrates a block diagram of SRAM array abut dummy cell layouts in accordance with some other embodiments.

FIG. 10 illustrates multiple adjacent SRAM array abut dummy cells 50 (labeled SRAM array abut dummy cells 50A through 50D) arranged in a grid 1000. Grid 1000 may be similar to grid 706 (see FIG. 7D) where like reference numerals indicate like elements. However, in grid 1000, CVdd lines 904A and 904B in a same column are physically separated and terminate in SRAM array abut dummy cells 50. For example, endpoints of CVdd lines 904A and 904B are disposed in SRAM array abut dummy cells 50A through 50D. Furthermore, CVdd lines 904A may be electrically connected to supply voltage line 902A by vias 1002A, which may be disposed in the via_1 level (see FIG. 3). CVdd lines 904B may be electrically connected to supply voltage line 902B by vias 1002B, which may be disposed in the via_1 level (see FIG. 3). Supply voltage lines 902A and 902B are disposed in the M2 level (see FIG. 3) and are substantially perpendicular to CVdd lines 904A and 904B. For example, supply voltage lines 902A and 902B are substantially parallel to CVss lines, and supply voltage lines 902A and 902B replace WLs that would otherwise be disposed in the M2 level over functional SRAM cell grids (see e.g., FIG. 6E). Supply voltage line 902A is physically separate from supply voltage line 902B, which allows CVdd lines 904A and 904B to be powered independently.

Because CVdd lines 904A and 904B may terminate in SRAM array abut dummy cells 50, CVdd lines 904A/904B may not reach CVdd nodes 102 (e.g., sources of pull-up transistors PU-1). Thus, in an embodiment, CVdd nodes 102 of SRAM array abut dummy cells 50 may not be electrically connected to CVdd, and electrical contacts to CVdd nodes 102 may be excluded. In another embodiment, such electrical contacts are included to electrically connect CVdd nodes 102 to CVdd lines 904A/904B. However, as SRAM array abut dummy cells 50 are not functional memory cells, the missed electrical connection is not a concern. In an embodiment, a SRAM dummy array (e.g., SRAM dummy array 204 in FIG. 10) includes multiple adjacent grids 1000 to provide two or more rows and any number of columns of SRAM array abut dummy cells 50.

Thus, as described above, various embodiments include a SRAM array having at least two SRAM mini arrays and a SRAM dummy array disposed between the two SRAM mini arrays. The SRAM dummy array includes SRAM array abut dummy cells, which are permanently deselected (e.g., having passed gates directly connected to electrical ground). Continuous BLs and BLBs are shared by each column of the SRAM mini arrays, and these continuous BLs and BLBs terminate in the SRAM dummy array. Thus, BLs and BLBs of each SRAM mini array are physically isolated from BLs and BLBs of other SRAM mini arrays. In an embodiment, CVdd lines of each SRAM mini array may also be physically isolated from CVdd lines of other SRAM mini arrays. Furthermore, the BLs and BLBs of each SRAM mini array is controlled by dedicated control circuitry for the SRAM mini array. By including the SRAM dummy array, SRAM mini arrays may be joined to provide a single SRAM array having an increased number of SRAM cells without the risk of overloading BLs or BLBs.

In accordance with an embodiment, a static random access memory (SRAM) array includes a first SRAM mini array having a first plurality of functional SRAM cells in a first column of the SRAM array. Each of the first plurality of functional SRAM cells share a first bit line (BL). The SRAM array further includes a second SRAM mini array having a second plurality of functional SRAM cells in the first column. Each of the second plurality of functional SRAM cells share a second BL independently controlled from the first BL. The SRAM array further includes a SRAM dummy array between the first SRAM mini array and the second SRAM mini array. The SRAM dummy array includes a plurality of SRAM array abut dummy cells in the first column. A first endpoint of the first BL and a second endpoint of the second BL are disposed in the SRAM dummy array.

In accordance with an embodiment, a device includes a first functional memory cell in a column of a memory array. The first functional memory cell includes first portions of a first bit line (BL) and a first bit line bar (BLB). The device further includes a first dummy memory cell in the column and adjacent the first functional memory cell. Second portions of the first BL and the first BLB are disposed in the first dummy memory cell. The device further includes a second dummy memory cell in the column and adjacent the first dummy memory cell and a second functional memory cell in the column and adjacent the second dummy memory cell. The second functional memory cell includes first portions of a second BL and a second BLB, and second portions of the second BL and the second BLB are disposed in the second dummy memory cell. The first BL is physically separated from the second BL, and the first BLB is physically separated from the second BLB.

In accordance with an embodiment, a method includes disposing a static random access memory (SRAM) dummy array between and adjoining a first SRAM mini array and a second SRAM mini array. The SRAM dummy array includes a plurality of SRAM dummy cells in a first column. The first SRAM mini array includes a first plurality of functional SRAM cells in the first column, and the second SRAM mini array includes a second plurality of functional SRAM cells in the first column. The method further includes electrically connecting first transistors in the first plurality of functional SRAM cells to a first bit line (BL). The first BL extends into a first SRAM dummy cell of the plurality of SRAM dummy cells. The method further includes electrically connecting second transistors in the second plurality of functional SRAM cells to a second BL physically separated from the first BL. The second BL extends directly into a second SRAM dummy cell of the plurality of SRAM dummy cells, and the first BL and the second BL are independently controlled.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) array comprising:
   a first SRAM mini array comprising a first plurality of functional SRAM cells in a first column of the SRAM array, wherein each of the first plurality of functional SRAM cells share a first bit line (BL);
   a second SRAM mini array comprising a second plurality of functional SRAM cells in the first column, wherein each of the second plurality of functional SRAM cells share a second BL independently controlled from the first BL; and
   a SRAM dummy array between the first SRAM mini array and the second SRAM mini array, wherein the SRAM dummy array comprises a plurality of SRAM array abut dummy cells in the first column, wherein a line extending along a longitudinal axis of the first BL extends through the first BL and the second BL in a top down view, and wherein a first endpoint of the first BL and a second endpoint of the second BL are disposed in the SRAM dummy array.

2. The SRAM array of claim 1, wherein each of the plurality of SRAM array abut dummy cells comprises:
   a first inverter;
   a second inverter, wherein an first input of the first inverter is electrically connected to an second output of the second inverter, and wherein a second input of the second inverter is electrically connected to a first output of the first inverter;

a first pass-gate transistor electrically connected to a first input; and a second pass-gate transistor electrically connected to the second input.

3. The SRAM cell of claim 2, wherein gates of the first pass-gate transistor and the second pass-gate transistor are electrically connected directly to electrical ground.

4. The SRAM array of claim 1, wherein each of the first plurality of functional SRAM cells share a first bit line bar (BLB), wherein each of the second plurality of functional SRAM cells share a second BLB independently controlled from the first BLB, and wherein a third endpoint of the first BLB and a fourth endpoint of the second BLB are disposed in the SRAM dummy array.

5. The SRAM array of claim 1, wherein each of the first plurality of functional SRAM cells share a first supply voltage line, wherein each of the second plurality of functional SRAM cells share a second supply voltage line, and wherein an fifth endpoint of the first supply voltage line and a sixth endpoint of the second supply voltage line are disposed in the SRAM dummy array.

6. The SRAM array of claim 1 further comprising a third BL between the first BL and the second BL, wherein the third BL is disposed entirely in the SRAM dummy array.

7. The SRAM array of claim 1, wherein the plurality of SRAM array abut dummy cells in the first column comprise:
a first SRAM array abut dummy cell adjacent one of the first plurality of SRAM cells; and
a second SRAM array abut dummy cell in adjacent one of the second plurality of SRAM cells and the first SRAM array abut dummy cell.

8. The SRAM array of claim 7, wherein the first SRAM array abut dummy cell has a first orientation, wherein the second SRAM array abut dummy cell has a second orientation, and wherein the second orientation is the first orientation vertically flipped across a first boundary between the first SRAM array abut dummy cell and the second SRAM array abut dummy cell.

9. The SRAM array of claim 8, wherein the SRAM dummy further comprises:
a third SRAM array abut dummy cell in a second column of the SRAM array and adjacent the first SRAM array abut dummy cell, wherein the third SRAM array abut dummy cell has a third orientation, and wherein the third orientation is the first orientation horizontally flipped across a second boundary between the first SRAM array abut dummy cell and the third SRAM array abut dummy cell; and
a fourth SRAM array abut dummy cell in the second column and adjacent the second SRAM array abut dummy cell, wherein the fourth SRAM array abut dummy cell has a fourth orientation, and wherein the fourth orientation is the second orientation horizontally flipped across a third boundary between the second SRAM array abut dummy cell and the fourth SRAM array abut dummy cell.

10. The SRAM array of claim 1 further comprising a continuous supply voltage line shared by the first plurality of SRAM cells and the second plurality of SRAM cells.

11. The SRAM array of claim 1, wherein the first BL is physically separated from the second BL.

12. A device comprising:
a first functional memory cell in a column of a memory array, wherein the first functional memory cell comprises first portions of a first bit line (BL) and a first bit line bar (BLB);
a first dummy memory cell in the column and adjacent the first functional memory cell, and wherein second portions of the first BL and the first BLB are disposed in the first dummy memory cell;
a second dummy memory cell in the column and adjacent the first dummy memory cell; and
a second functional memory cell in the column and adjacent the second dummy memory cell, wherein the second functional memory cell comprises first portions of a second BL and a second BLB, wherein second portions of the second BL and the second BLB are disposed in the second dummy memory cell, wherein the first BL is physically separated from the second BL, and wherein the first BLB is physically separated from the second BLB.

13. The memory array of claim 12, wherein the first functional memory cell comprises:
a first pair of cross-connected inverters providing two storage data nodes;
a first pass-gate transistor electrically connected to the first pair of cross-connected inverters; and
a second pass-gate transistor electrically connected to the first pair of cross-connected inverters, wherein gates of the first pass-gate transistor and the second pass-gate transistor are electrically connected to a word line.

14. The memory array of claim 12, wherein the first dummy memory cell comprises:
a second pair of cross-connected inverters;
a third pass-gate transistor electrically connected to the second pair of cross-connected inverters; and
a fourth pass-gate transistor electrically connected to the second pair of cross-connected inverters, wherein gates of the third pass-gate transistor and the fourth pass-gate transistor are electrically connected directly to electrical ground.

15. The memory array of claim 12 further comprising:
a third BL disposed between and physically separated from the first BL and the second BL; and
a third BLB disposed between and physically separated from the first BLB and the second BLB.

16. The memory array of claim 12 further comprising:
a first supply voltage line having a first portion in the first functional memory cell and a second portion disposed in the first dummy memory cell; and
a second supply voltage line having a third portion in the second functional memory cell and a fourth portion disposed in the second dummy memory cell, wherein the second supply voltage line is physically separated and powered independently from the first supply voltage line.

17. The memory array of claim 12, wherein the first BL and the first BLB are controlled by first control circuitry, and wherein the second BL and the second BLB are controlled by second control circuitry independent from the first control circuitry.

18. A method comprising:
disposing a Static Random Access Memory (SRAM) dummy array between and adjoining a first SRAM mini array and a second SRAM mini array, wherein the SRAM dummy array comprises a plurality of SRAM dummy cells in a first column, wherein each of the plurality of SRAM dummy cells are permanently deselected, wherein the first SRAM mini array comprises a first plurality of functional SRAM cells in the first column, and wherein the second SRAM mini array comprises a second plurality of functional SRAM cells in the first column;

electrically connecting first transistors in the first plurality of functional SRAM cells to a first bit line (BL), wherein the first BL extends into a first SRAM dummy cell of the plurality of SRAM dummy cells;

electrically connecting second transistors in the second plurality of functional SRAM cells to a second BL physically separated from the first BL, wherein the second BL extends directly into a second SRAM dummy cell of the plurality of SRAM dummy cells, and wherein the first BL and the second BL are independently controlled.

19. The method of claim 18 further comprising electrically connecting a third transistor of the first SRAM dummy cell and a fourth transistor of the second SRAM dummy cell to a third BL disposed between the first BL and the second BL, wherein the third BL is physically separated from the first BL and the second BL.

20. The method of claim 18 further comprising:

electrically connecting fifth transistors of the first plurality of functional SRAM cells to a first supply voltage line; and electrically connecting sixth transistors of the second plurality of functional SRAM cells to a second supply voltage line physically separated from the first supply voltage line.

* * * * *